United States Patent
Mizuno

(10) Patent No.: US 8,887,108 B1
(45) Date of Patent: Nov. 11, 2014

(54) SUPPORT APPARATUS, DESIGN SUPPORT METHOD, AND RECORDING MEDIUM

(71) Applicant: Fujitsu Limited, Kawasaki (JP)

(72) Inventor: Rimi Mizuno, Setagaya (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/277,083

(22) Filed: May 14, 2014

(51) Int. Cl.
 *G06F 17/50* (2006.01)
(52) U.S. Cl.
 CPC ................ *G06F 17/5045* (2013.01)
 USPC ........................................... 716/100
(58) Field of Classification Search
 CPC ................... G06F 17/30; G06F 17/50
 USPC ........................................... 716/100
 See application file for complete search history.

(56) References Cited

U.S. PATENT DOCUMENTS

| | | | |
|---|---|---|---|
| 2005/0055657 A1* | 3/2005 | Jones | 716/18 |
| 2006/0282813 A1* | 12/2006 | Jones | 716/18 |
| 2012/0054707 A1* | 3/2012 | Goodman et al. | 716/119 |
| 2012/0066654 A1* | 3/2012 | Hopkins et al. | 716/102 |
| 2012/0232849 A1* | 9/2012 | Kosugi | 703/1 |

FOREIGN PATENT DOCUMENTS

| | | |
|---|---|---|
| JP | 09-69119 | 3/1997 |
| JP | 2000-57197 | 2/2000 |

* cited by examiner

*Primary Examiner* — Vuthe Siek
*Assistant Examiner* — Mohammed Alam
(74) *Attorney, Agent, or Firm* — Fujitsu Patent Center

(57) ABSTRACT

A design support apparatus includes a memory and a processor coupled to the memory. The processor executes a process including: for each of the plurality of first cells, selecting the second cell connected via the wire to the identified another first cell, the another first cell being included in the identified other first cells, when the identified another first cell is included in the identified other first cells; for each of the plurality of first cells, registering, in the first information, information that the first cell and the selected second cell are connected via the wire when the first cell and the selected second cell satisfy predetermined design rules; and copying the selected second cell, and registering, in the first information, information that the copied second cell and the first cell are connected via the wire when the predetermined design rules are not satisfied.

5 Claims, 26 Drawing Sheets

FIG.3 group1:/hier1/FF1,/hier1/FF2,/hier2/FF6,/hier3/FF8;
group2:/hier1/FF3,/hier2/FF4,/hier3/FF9,/hier3/FF10,/hier4/FF12;
gropu3:/hier2/FF5,/hier4/FF14;
group4:/hier4/FF13;
group5:/hier2/FF7,/hier3/FF11;

FIG.4

MaxFanout:8;
DEF:/xx/yy;
LEF:/aa/bb;
⋮

FIG.5

| ff, latch | PROCESS TARGET | Group BEFORE REDISTRI- BUTION | Group AFTER REDISTRI- BUTION | UPSTREAM cell BEFORE REDISTRI- BUTION | UPSTREAM cell AFTER REDISTRI- BUTION | INPUT PIN CAPACI- TANCE |
|---|---|---|---|---|---|---|
| FF1 | Y | 1 | 1 | chp1 | | 0.336 |
| FF2 | Y | 1 | 1 | chp1 | | 0.622 |
| FF3 | Y | 1 | 2 | chp1 | | 0.413 |
| FF4 | Y | 1 | 2 | chp1 | | 0.384 |
| FF5 | Y | 1 | 3 | chp1 | | 0.253 |
| FF6 | Y | 2 | 1 | chp2 | | 0.537 |
| FF7 | Y | 2 | 5 | chp2 | | 0.778 |
| FF8 | Y | 2 | 1 | chp2 | | 0.446 |
| FF9 | Y | 2 | 2 | chp2 | | 0.418 |
| FF10 | Y | 3 | 2 | chp3 | | 0.575 |
| FF11 | Y | 3 | 5 | chp3 | | 0.345 |
| FF12 | Y | 3 | 2 | chp3 | | 0.743 |
| FF13 | Y | 3 | 4 | chp3 | | 0.217 |
| FF14 | Y | 3 | 3 | chp3 | | 0.366 |
| FFA | N | 3 | – | chp3 | chp3 | 0.694 |
| FFB | N | 3 | – | chp3 | chp3 | 0.441 |

| IDEN-TIFIER | INPUT PIN | DRIVE PIN | SAME CONNECTIONS TO ALL INPUT PINS | CONNECTED latch, ff BEFORE RE-DISTRIBUTION | CONNECTED latch, ff AFTER RE-DISTRIBUTION | CONNECTED Group AFTER RE-DISTRIBUTION | OUTPUT PIN fanout NUMBER | OUTPUT PIN DRIVABILITY |
|---|---|---|---|---|---|---|---|---|
| chp1 | A1 CWS IH | clk13_1.X instA.X instB.X |  | FF1, FF2, FF3, FF4, FF5 |  |  | 5 | 3.883 |
| chp2 | A1 CWS IH | clk13_1.X instA.X instC.X |  | FF6, FF7, FF8, FF9 |  |  | 4 | 5.291 |
| chp3 | A1 CWS IH | clk13_1.X instA.X instB.X | chp1 | FF10, FF11, FF12, FF13, FF14, FFA, FFB | FFA, FFB | — | 2 | 2.224 |

| ff, latch | PROCESS TARGET | Group BEFORE REDISTRI- BUTION | Group AFTER REDISTRI- BUTION | UPSTREAM cell BEFORE REDISTRI- BUTION | UPSTREAM cell AFTER REDISTRI- BUTION | INPUT PIN CAPACI- TANCE |
|---|---|---|---|---|---|---|
| FF1 | Y | 1 | 1 | chp1 | | 0.336 |
| FF2 | Y | 1 | 1 | chp1 | | 0.622 |
| FF3 | Y | 1 | 2 | chp1 | | 0.413 |
| FF4 | Y | 1 | 2 | chp1 | | 0.384 |
| FF5 | Y | 1 | 3 | chp1 | | 0.253 |
| FF6 | Y | 2 | 1 | chp2 | | 0.537 |
| FF7 | Y | 2 | 5 | chp2 | | 0.778 |
| FF8 | Y | 2 | 1 | chp2 | | 0.446 |
| FF9 | Y | 2 | 2 | chp2 | | 0.418 |
| FF10 | Y | 3 | 2 | chp3 | | 0.575 |
| FF11 | Y | 3 | 5 | chp3 | | 0.345 |
| FF12 | Y | 3 | 2 | chp3 | | 0.743 |
| FF13 | Y | 3 | 4 | chp3 | | 0.217 |
| FF14 | Y | 3 | 3 | chp3 | | 0.366 |
| FFA | N | 3 | – | chp3 | chp3 | 0.694 |
| FFB | N | 3 | – | chp3 | chp3 | 0.441 |

FIG.8

| IDEN-TIFIER | INPUT PIN | DRIVE PIN | SAME CONNECTIONS TO ALL INPUT PINS | CONNECTED latch, ff BEFORE RE-DISTRIBUTION | CONNECTED latch, ff AFTER RE-DISTRIBUTION | CONNECTED Group AFTER RE-DISTRIBUTION | OUTPUT PIN fanout NUMBER | OUTPUT PIN DRIVABILITY |
|---|---|---|---|---|---|---|---|---|
| chp1 | A1 CWS IH X | clk13_1.X instA.X instB.X | chp3 | FF1, FF2, FF3, FF4, FF5 | | | | 3.883 |
| chp2 | A1 CWS IH X | clk13_1.X instA.X instC.X | | FF6, FF7, FF8, FF9 | | | | 5.291 |
| chp3 | A1 CWS IH X | clk13_1.X instA.X instB.X | chp1 | FF10, FF11, FF12, FF13, FF14, FFA, FFB | FFA, FFB | — | 2 | 2.224 |

| ff, latch | PROCESS TARGET | Group BEFORE REDISTRI- BUTION | Group AFTER REDISTRI- BUTION | UPSTREAM cell BEFORE REDISTRI- BUTION | UPSTREAM cell AFTER REDISTR- IBUTION | INPUT PIN CAPACI- TANCE |
|---|---|---|---|---|---|---|
| FF1 | Y | 1 | 1 | chp1 | chp1 | 0.336 |
| FF2 | Y | 1 | 1 | chp1 |  | 0.622 |
| FF3 | Y | 1 | 2 | chp1 |  | 0.413 |
| FF4 | Y | 1 | 2 | chp1 |  | 0.384 |
| FF5 | Y | 1 | 3 | chp1 |  | 0.253 |
| FF6 | Y | 2 | 1 | chp2 |  | 0.537 |
| FF7 | Y | 2 | 5 | chp2 |  | 0.778 |
| FF8 | Y | 2 | 1 | chp2 |  | 0.446 |
| FF9 | Y | 2 | 2 | chp2 |  | 0.418 |
| FF10 | Y | 3 | 2 | chp3 |  | 0.575 |
| FF11 | Y | 3 | 5 | chp3 |  | 0.345 |
| FF12 | Y | 3 | 2 | chp3 |  | 0.743 |
| FF13 | Y | 3 | 4 | chp3 |  | 0.217 |
| FF14 | Y | 3 | 3 | chp3 |  | 0.366 |
| FFA | N | 3 | - | chp3 | chp3 | 0.694 |
| FFB | N | 3 | - | chp3 | chp3 | 0.441 |

FIG.10

| IDEN-TIFIER | INPUT PIN | DRIVE PIN | SAME CONNECTIONS TO ALL INPUT PINS | CONNECTED latch, ff BEFORE RE-DISTRIBUTION | CONNECTED latch, ff AFTER RE-DISTRIBUTION | CONNECTED Group AFTER RE-DISTRIBUTION | OUTPUT PIN fanout NUMBER | OUTPUT PIN DRIVABILITY |
|---|---|---|---|---|---|---|---|---|
| chp1 | A1 CWS IH X | clk13_1.X instA.X instB.X | chp3 | FF1, FF2, FF3, FF4, FF5 | FF1 | 1 | 1 | 3.883 |
| chp2 | A1 CWS IH X | clk13_1.X instA.X instC.X | | FF6, FF7, FF8, FF9 | | | | 5.291 |
| chp3 | A1 CWS IH X | clk13_1.X instA.X instB.X | chp1 | FF10, FF11, FF12, FF13, FF14, FFA, FFB | FFA, FFB | — | 2 | 2.224 |

| ff, latch | PROCESS TARGET | Group BEFORE REDISTRI-BUTION | Group AFTER REDISTRI-BUTION | UPSTREAM cell BEFORE REDISTRI-BUTION | UPSTREAM cell AFTER REDISTRI-BUTION | INPUT PIN CAPACI-TANCE |
|---|---|---|---|---|---|---|
| FF1 | Y | 1 | 1 | chp1 | chp1 | 0.336 |
| FF2 | Y | 1 | 1 | chp1 | chp1 | 0.622 |
| FF3 | Y | 1 | 2 | chp1 | | 0.413 |
| FF4 | Y | 1 | 2 | chp1 | | 0.384 |
| FF5 | Y | 1 | 3 | chp1 | | 0.253 |
| FF6 | Y | 2 | 1 | chp2 | | 0.537 |
| FF7 | Y | 2 | 5 | chp2 | | 0.778 |
| FF8 | Y | 2 | 1 | chp2 | | 0.446 |
| FF9 | Y | 2 | 2 | chp2 | | 0.418 |
| FF10 | Y | 3 | 2 | chp3 | | 0.575 |
| FF11 | Y | 3 | 5 | chp3 | | 0.345 |
| FF12 | Y | 3 | 2 | chp3 | | 0.743 |
| FF13 | Y | 3 | 4 | chp3 | | 0.217 |
| FF14 | Y | 3 | 3 | chp3 | | 0.366 |
| FFA | N | 3 | - | chp3 | chp3 | 0.694 |
| FFB | N | 3 | - | chp3 | chp3 | 0.441 |

FIG.12

| IDEN-TIFIER | INPUT PIN | DRIVE PIN | SAME CONNECTIONS TO ALL INPUT PINS | CONNECTED latch, ff BEFORE RE-DISTRIBUTION | CONNECTED latch, ff AFTER RE-DISTRIBUTION | CONNECTED Group AFTER RE-DISTRIBUTION | OUTPUT PIN fanout NUMBER | OUTPUT PIN DRIVABILITY |
|---|---|---|---|---|---|---|---|---|
| chp1 | A1 CWS IH X | clk13_1.X instA.X instB.X | chp3 | FF1, FF2, FF3, FF4, FF5 | FF1, FF2 | 1 | 2 | 3.883 |
| chp2 | A1 CWS IH X | clk13_1.X instA.X instC.X |  | FF6, FF7, FF8, FF9 |  |  |  | 5.291 |
| chp3 | A1 CWS IH X | clk13_1.X instA.X instB.X | chp1 | FF10, FF11, FF12, FF13, FF14, FFA, FFB | FFA, FFB | — | 2 | 2.224 |

| ff, latch | PROCESS TARGET | Group BEFORE REDISTRI-BUTION | Group AFTER REDISTRI-BUTION | UPSTREAM cell BEFORE REDISTRI-BUTION | UPSTREAM cell AFTER REDISTRI-BUTION | INPUT PIN CAPACI-TANCE |
|---|---|---|---|---|---|---|
| FF1 | Y | 1 | 1 | chp1 | chp1 | 0.336 |
| FF2 | Y | 1 | 1 | chp1 | chp1 | 0.622 |
| FF3 | Y | 1 | 2 | chp1 | | 0.413 |
| FF4 | Y | 1 | 2 | chp1 | | 0.384 |
| FF5 | Y | 1 | 3 | chp1 | | 0.253 |
| FF6 | Y | 2 | 1 | chp2 | chp2 | 0.537 |
| FF7 | Y | 2 | 5 | chp2 | | 0.778 |
| FF8 | Y | 2 | 1 | chp2 | | 0.446 |
| FF9 | Y | 2 | 2 | chp2 | | 0.418 |
| FF10 | Y | 3 | 2 | chp3 | | 0.575 |
| FF11 | Y | 3 | 5 | chp3 | | 0.345 |
| FF12 | Y | 3 | 2 | chp3 | | 0.743 |
| FF13 | Y | 3 | 4 | chp3 | | 0.217 |
| FF14 | Y | 3 | 3 | chp3 | | 0.366 |
| FFA | N | 3 | – | chp3 | chp3 | 0.694 |
| FFB | N | 3 | – | chp3 | chp3 | 0.441 |

FIG.14

| IDEN-TIFIER | INPUT PIN | DRIVE PIN | SAME CONNECTIONS TO ALL INPUT PINS | CONNECTED latch, ff BEFORE RE-DISTRIBUTION | CONNECTED latch, ff AFTER RE-DISTRIBUTION | CONNECTED Group AFTER RE-DISTRIBUTION | OUTPUT PIN fanout NUMBER | OUTPUT PIN DRIVABILITY |
|---|---|---|---|---|---|---|---|---|
| chp1 | A1 CWS IH X | clk13_1.X instA.X instB.X |  | FF1, FF2, FF3, FF4, FF5 | FF1, FF2 | 1 | 2 | 3.883 |
| chp2 | A1 CWS IH X | clk13_1.X instA.X instC.X | chp3 | FF6, FF7, FF8, FF9 | FF6 | 1 | 1 | 5.291 |
| chp3 | A1 CWS IH X | clk13_1.X instA.X instB.X | chp1 | FF10, FF11, FF12, FF13, FF14, FFA, FFB | FFA, FFB | — | 2 | 2.224 |

| ff, latch | PROCESS TARGET | Group BEFORE REDISTRI- BUTION | Group AFTER REDISTRI- BUTION | UPSTREAM cell BEFORE REDISTRI- BUTION | UPSTREAM cell AFTER REDISTRI- BUTION | INPUT PIN CAPACI- TANCE |
|---|---|---|---|---|---|---|
| FF1 | Y | 1 | 1 | chp1 | chp1 | 0.336 |
| FF2 | Y | 1 | 1 | chp1 | chp1 | 0.622 |
| FF3 | Y | 1 | 2 | chp1 | | 0.413 |
| FF4 | Y | 1 | 2 | chp1 | | 0.384 |
| FF5 | Y | 1 | 3 | chp1 | | 0.253 |
| FF6 | Y | 2 | 1 | chp2 | chp2 | 0.537 |
| FF7 | Y | 2 | 5 | chp2 | | 0.778 |
| FF8 | Y | 2 | 1 | chp2 | chp2 | 0.446 |
| FF9 | Y | 2 | 2 | chp2 | | 0.418 |
| FF10 | Y | 3 | 2 | chp3 | | 0.575 |
| FF11 | Y | 3 | 5 | chp3 | | 0.345 |
| FF12 | Y | 3 | 2 | chp3 | | 0.743 |
| FF13 | Y | 3 | 4 | chp3 | | 0.217 |
| FF14 | Y | 3 | 3 | chp3 | | 0.366 |
| FFA | N | 3 | – | chp3 | chp3 | 0.694 |
| FFB | N | 3 | – | chp3 | chp3 | 0.441 |

FIG.16

| IDEN-TIFIER | INPUT PIN | DRIVE PIN | SAME CONNECTIONS TO ALL INPUT PINS | CONNECTED latch, ff BEFORE RE-DISTRIBUTION | CONNECTED latch, ff AFTER RE-DISTRIBUTION | CONNECTED Group AFTER RE-DISTRIBUTION | OUTPUT PIN fanout NUMBER | OUTPUT PIN DRIVABILITY |
|---|---|---|---|---|---|---|---|---|
| chp1 | A1 CWS IH X | clk13_1.X instA.X instB.X | chp3 | FF1, FF2, FF3, FF4, FF5 | FF1, FF2 | 1 | 2 | 3.883 |
| chp2 | A1 CWS IH X | clk13_1.X instA.X instC.X | | FF6, FF7, FF8, FF9 | FF6, FF8 | 1 | 2 | 5.291 |
| chp3 | A1 CWS IH X | clk13_1.X instA.X instB.X | chp1 | FF10, FF11, FF12, FF13, FF14, FFA, FFB | FFA, FFB | — | 2 | 2.224 |

FIG.17

| ff, latch | PROCESS TARGET | Group BEFORE REDISTRI-BUTION | Group AFTER REDISTRI-BUTION | UPSTREAM cell BEFORE REDISTRI-BUTION | UPSTREAM cell AFTER REDISTRI-BUTION | INPUT PIN CAPACI-TANCE |
|---|---|---|---|---|---|---|
| FF1 | Y | 1 | 1 | chp1 | chp1 | 0.336 |
| FF2 | Y | 1 | 1 | chp1 | chp1 | 0.622 |
| FF3 | Y | 1 | 2 | chp1 | chp1_2 | 0.413 |
| FF4 | Y | 1 | 2 | chp1 | | 0.384 |
| FF5 | Y | 1 | 3 | chp1 | | 0.253 |
| FF6 | Y | 2 | 1 | chp2 | chp2 | 0.537 |
| FF7 | Y | 2 | 5 | chp2 | | 0.778 |
| FF8 | Y | 2 | 1 | chp2 | chp2 | 0.446 |
| FF9 | Y | 2 | 2 | chp2 | | 0.418 |
| FF10 | Y | 3 | 2 | chp3 | | 0.575 |
| FF11 | Y | 3 | 5 | chp3 | | 0.345 |
| FF12 | Y | 3 | 2 | chp3 | | 0.743 |
| FF13 | Y | 3 | 4 | chp3 | | 0.217 |
| FF14 | Y | 3 | 3 | chp3 | | 0.366 |
| FFA | N | 3 | – | chp3 | chp3 | 0.694 |
| FFB | N | 3 | – | chp3 | chp3 | 0.441 |

FIG.18

| IDEN-TIFIER | INPUT PIN | DRIVE PIN | SAME CONNECTIONS TO ALL INPUT PINS | CONNECTED latch, ff BEFORE RE-DISTRIBUTION | CONNECTED latch, ff AFTER RE-DISTRIBUTION | CONNECTED Group AFTER RE-DISTRIBUTION | OUTPUT PIN fanout NUMBER | OUTPUT PIN DRIVABILITY |
|---|---|---|---|---|---|---|---|---|
| chp1 | A1 CWS IH X | clk13_1.X instA.X instB.X | chp3, chp1_2 | FF1, FF2, FF3, FF4, FF5 | FF1, FF2 | 1 | 2 | 3.883 |
| chp2 | A1 CWS IH X | clk13_1.X instA.X instC.X | | FF6, FF7, FF8, FF9 | FF6, FF8 | 1 | 2 | 5.291 |
| chp3 | A1 CWS IH X | clk13_1.X instA.X instB.X | chp1, chp1_2 | FF10, FF11, FF12, FF13, FF14, FFA, FFB | FFA, FFB | — | 2 | 2.224 |
| chp1_2 | A1 CWS IH X | clk13_1.X instA.X instB.X | chp1, chp3 | | FF3 | 2 | 1 | 3.883 |

| ff, latch | PROCESS TARGET | Group BEFORE REDISTRI- BUTION | Group AFTER REDISTRI- BUTION | UPSTREAM cell BEFORE REDISTRI- BUTION | UPSTREAM cell AFTER REDISTRI- BUTION | INPUT PIN CAPACI- TANCE |
|---|---|---|---|---|---|---|
| FF1 | Y | 1 | 1 | chp1 | chp1 | 0.336 |
| FF2 | Y | 1 | 1 | chp1 | chp1 | 0.622 |
| FF3 | Y | 1 | 2 | chp1 | chp1_2 | 0.413 |
| FF4 | Y | 1 | 2 | chp1 | chp1_2 | 0.384 |
| FF5 | Y | 1 | 3 | chp1 | | 0.253 |
| FF6 | Y | 2 | 1 | chp2 | chp2 | 0.537 |
| FF7 | Y | 2 | 5 | chp2 | | 0.778 |
| FF8 | Y | 2 | 1 | chp2 | chp2 | 0.446 |
| FF9 | Y | 2 | 2 | chp2 | chp2_2 | 0.418 |
| FF10 | Y | 3 | 2 | chp3 | chp1_2 | 0.575 |
| FF11 | Y | 3 | 5 | chp3 | | 0.345 |
| FF12 | Y | 3 | 2 | chp3 | chp1_2 | 0.743 |
| FF13 | Y | 3 | 4 | chp3 | | 0.217 |
| FF14 | Y | 3 | 3 | chp3 | | 0.366 |
| FFA | N | 3 | — | chp3 | chp3 | 0.694 |
| FFB | N | 3 | — | chp3 | chp3 | 0.441 |

FIG.20

| IDEN-TIFIER | INPUT PIN | DRIVE PIN | SAME CONNECTIONS TO ALL INPUT PINS | CONNECTED latch, ff BEFORE RE-DISTRIBUTION | CONNECTED latch, ff AFTER RE-DISTRIBUTION | CONNECTED Group AFTER RE-DISTRIBUTION | OUTPUT PIN fanout NUMBER | OUTPUT PIN DRIVABILITY |
|---|---|---|---|---|---|---|---|---|
| chp1 | A1 CWS IH X | clk13_1.X instA.X instB.X | chp3, chp1_2 | FF1, FF2, FF3, FF4, FF5 | FF1, FF2 | 1 | 2 | 3.883 |
| chp2 | A1 CWS IH X | clk13_1.X instA.X instC.X | chp2_2 | FF6, FF7, FF8, FF9 | FF6, FF8 | 1 | 2 | 5.291 |
| chp3 | A1 CWS IH X | clk13_1.X instA.X instB.X | chp1, chp1_2 | FF10, FF11, FF12, FF13, FF14, FFA, FFB | FFA, FFB | 1 | 2 | 2.224 |
| chp1_2 | A1 CWS IH X | clk13_1.X instA.X instB.X | chp1, chp3 | | FF3, FF4, FF10, FF12 | 2 | 4 | 3.883 |
| chp2_2 | A1 CWS IH X | clk13_1.X instA.X instC.X | chp2 | | FF9 | 2 | 1 | 5.291 |

FIG.21

| ff, latch | PROCESS TARGET | Group BEFORE REDISTRI-BUTION | Group AFTER REDISTRI-BUTION | UPSTREAM cell BEFORE REDISTRI-BUTION | UPSTREAM cell AFTER REDISTRI-BUTION | INPUT PIN CAPACI-TANCE |
|---|---|---|---|---|---|---|
| FF1 | Y | 1 | 1 | chp1 | chp1 | 0.336 |
| FF2 | Y | 1 | 1 | chp1 | chp1 | 0.622 |
| FF3 | Y | 1 | 2 | chp1 | chp1_2 | 0.413 |
| FF4 | Y | 1 | 2 | chp1 | chp1_2 | 0.384 |
| FF5 | Y | 1 | 3 | chp1 | chp1_3 | 0.253 |
| FF6 | Y | 2 | 1 | chp2 | chp2 | 0.537 |
| FF7 | Y | 2 | 5 | chp2 | chp2_3 | 0.778 |
| FF8 | Y | 2 | 1 | chp2 | chp2 | 0.446 |
| FF9 | Y | 2 | 2 | chp2 | chp2_2 | 0.418 |
| FF10 | Y | 3 | 2 | chp3 | chp1_2 | 0.575 |
| FF11 | Y | 3 | 5 | chp3 | chp3_3 | 0.345 |
| FF12 | Y | 3 | 2 | chp3 | chp1_2 | 0.743 |
| FF13 | Y | 3 | 4 | chp3 | chp3_2 | 0.217 |
| FF14 | Y | 3 | 3 | chp3 | chp1_3 | 0.366 |
| FFA | N | 3 | – | chp3 | chp3 | 0.694 |
| FFB | N | 3 | – | chp3 | chp3 | 0.441 |

| IDEN-TIFIER | IN-PUT PIN | DRIVE PIN | SAME CONNEC-TIONS TO ALL INPUT PINS | CON-NECTED latch, ff BEFORE REDISTRI-BUTION | CON-NECTED latch, ff AFTER REDISTRI-BUTION | CON-NECTED Group AFTER RE-DISTRI-BUTION (2e) | OUT-PUT PIN fanout NUM-BER | OUTPUT PIN DRIV-ABILITY |
|---|---|---|---|---|---|---|---|---|
| chp1 | A1 CWS IH X | clk13_1.X instA.X instB.X | chp3, chp1_2, chp1_3, chp3_2, chp3_3 | FF1, FF2, FF3, FF4, FF5 | FF1, FF2 | 1 | 2 | 3.883 |
| chp2 | A1 CWS IH X | clk13_1.X instA.X instC.X | chp2_2, chp2_3 | FF6, FF7, FF8, FF9 | FF6, FF8 | 1 | 2 | 5.291 |
| chp3 | A1 CWS IH X | clk13_1.X instA.X instB.X | chp1, chp1_2, chp1_3, chp3_2, chp3_3 | FF10, FF11, FF12, FF13, FF14, FFA, FFB | FFA, FFB | – | 2 | 2.224 |
| chp1_2 | A1 CWS IH X | clk13_1.X instA.X instB.X | chp1, chp3, chp1_3, chp3_2, chp3_3 | | FF3, FF4, FF10, FF12 | 2 | 4 | 3.883 |
| chp2_2 | A1 CWS IH X | clk13_1.X instA.X instC.X | chp2, chp2_3 | | FF9 | 2 | 1 | 5.291 |
| chp1_3 | A1 CWS IH X | clk13_1.X instA.X instB.X | chp1, chp3, chp1_2, chp3_2, chp3_3 | | FF5, FF14 | 3 | 2 | 3.883 |
| chp3_2 | A1 CWS IH X | clk13_1.X instA.X instB.X | chp1, chp3, chp1_2, chp1_3, chp3_3 | | FF13 | 4 | 1 | 2.224 |
| chp2_3 | A1 CWS IH X | clk13_1.X instA.X instC.X | chp2, chp2_2 | | FF7 | 5 | 1 | 5.291 |
| chp3_3 | A1 CWS IH X | clk13_1.X instA.X instB.X | chp1, chp3, chp1_2, chp1_3, chp3_2 | | FF11 | 5 | 1 | 2.224 |

SUPPORT APPARATUS, DESIGN SUPPORT METHOD, AND RECORDING MEDIUM

CROSS-REFERENCE TO RELATED APPLICATION

This application is based upon and claims the benefit of priority of the prior Japanese Patent Application No. 2013-157124, filed on Jul. 29, 2013, the entire contents of which are incorporated herein by reference.

FIELD

The embodiment discussed herein is related to a design support apparatus, a design support method, and a recording medium.

BACKGROUND

Various methods for generating a clock tree in such a manner as to satisfy various design rules are known in circuit design. For example, there is a technology for acquiring register information of a block having a change in floor planning and generating an optimal clock tree for each block based on the acquired information.

Moreover, if placement of cells such as a flip-flop (Flip Flop; FF) and a latch is modified after generation of a clock tree, the clock tree is modified with the modification of the placement of cells. In the following description, modifying the clock tree may be expressed as "redistributing the clock tree," and similarly the modification of the clock tree as the "redistribution of the clock tree."

An example of the above-mentioned technology for redistributing the clock tree is a known technology for redistributing the clock tree manually by the designer of the circuit.

Moreover, another example of the technology for redistributing the clock tree is a known technology for saving the clock tree already generated and changing the existing clock tree in the following manner if there is an additionally placed cell. In other words, such a known technology changes the existing clock tree by connecting a clock wire to the added cell as close as possible within the existing wiring of the clock net.

Patent Document 1: Japanese Laid-open Patent Publication No. 2000-057197
Patent Document 2: Japanese Laid-open Patent Publication No. 09-069119

However, in the above-mentioned known technologies for redistributing the clock tree, the clock tree is redistributed in such a manner as to satisfy various design rules. It is not easy to satisfy various design rules. Hence, the known technologies have a problem that the redistribution of the clock tree is difficult.

SUMMARY

According to an aspect of the embodiments, a design support apparatus includes a memory and a processor coupled to the memory. The processor executes a process. The process includes: storing first information indicating a predetermined circuit including a plurality of first cells operating based on an input clock signal, a plurality of second cells that inputs the clock signal into any of the plurality of first cells via wires, and the wires that connect each of the plurality of first cells and each of the plurality of second cells, and second information indicating the content of a change in a placement of the first cell in the predetermined circuit, the second information being defined such that the first cells connected to the same second cell belong to the same group; for each of the plurality of first cells, first identifying the second cell connected to the first cell via the wire in the predetermined circuit based on the first information; second identifying another second cell whose input terminals are connected to cells being the same as cells connected to input terminals of the second cell; third identifying other first cells connected via the wires to the identified second cell and another second cell; fourth identifying another first cell belonging to the same group based on the second information for each of the plurality of first cells; for each of the plurality of first cells, selecting the second cell connected via the wire to the another first cell identified at the fourth identifying, the another first cell being included in the other first cells identified at the first to third identifying, when the another first cell identified at the fourth identifying is included in the other first cells identified at the first to third identifying; for each of the plurality of first cells, registering, in the first information, information that the first cell and the second cell selected at the selecting are connected via the wire when the first cell and the second cell selected at the selecting satisfy predetermined design rules; and copying the second cell selected at the selecting, and registering, in the first information, information that the copied second cell and the first cell are connected via the wire when the predetermined design rules are not satisfied.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 3 is a diagram illustrating an example of redistribution information;

FIG. 4 illustrates an example of design rules;

FIG. 5 is a diagram illustrating an example of processes to be executed by an analysis unit;

FIG. 6 is a diagram illustrating an example of processes to be executed by the analysis unit;

FIG. 7 is a diagram illustrating an example of a first analysis table used in the processes;

FIG. 8 is a diagram illustrating an example of a second analysis table used in the processes;

FIG. 9 is a diagram illustrating an example of the first analysis table used in the processes;

FIG. 10 is a diagram illustrating an example of the second analysis table used in the processes;

FIG. 11 is a diagram illustrating an example of the first analysis table used in the processes;

FIG. 12 is a diagram illustrating an example of the second analysis table used in the processes;

FIG. 13 is a diagram illustrating an example of the first analysis table used in the processes;

FIG. 14 is a diagram illustrating an example of the second analysis table used in the processes;

FIG. 15 is a diagram illustrating an example of the first analysis table used in the processes;

FIG. 16 is a diagram illustrating an example of the second analysis table used in the processes;

FIG. 17 is a diagram illustrating an example of the first analysis table used in the processes;

FIG. 18 is a diagram illustrating an example of the second analysis table used in the processes;

FIG. 19 is a diagram illustrating an example of the first analysis table as a result of having similarly performed the processes also on cells 18_4, 18_9, 18_10, and 18_12 that belong to a group 2 indicated by the redistribution information of FIG. 3;

FIG. 20 is a diagram illustrating an example of the second analysis table as a result of having similarly performed the processes also on the cells 18_4, 18_9, 18_10, and 18_12 that belong to the group 2 indicated by the redistribution information of FIG. 3;

FIG. 21 is a diagram illustrating an example of the first analysis table as a result of having similarly performed the processes also on cells 18_5 and 18_14 that belong to a group 3, a cell 18_13 that belongs to a group 4, and cells 18_7 and 18_11 that belong to a group 5, the cells being indicated by the redistribution information of FIG. 3;

FIG. 22 is a diagram illustrating an example of the second analysis table as a result of having similarly performed the processes also on the cells 18_5 and 18_14 that belong to the group 3, the cell 18_13 that belongs to the group 4, and the cells 18_7 and 18_11 that belong to the group 5, the cells being indicated by the redistribution information of FIG. 3;

DESCRIPTION OF EMBODIMENTS

Preferred embodiments will be explained with reference to accompanying drawings. The embodiment does not limit the disclosed technology.

Example of Functional Configuration of Design Support Apparatus

Figure 1:
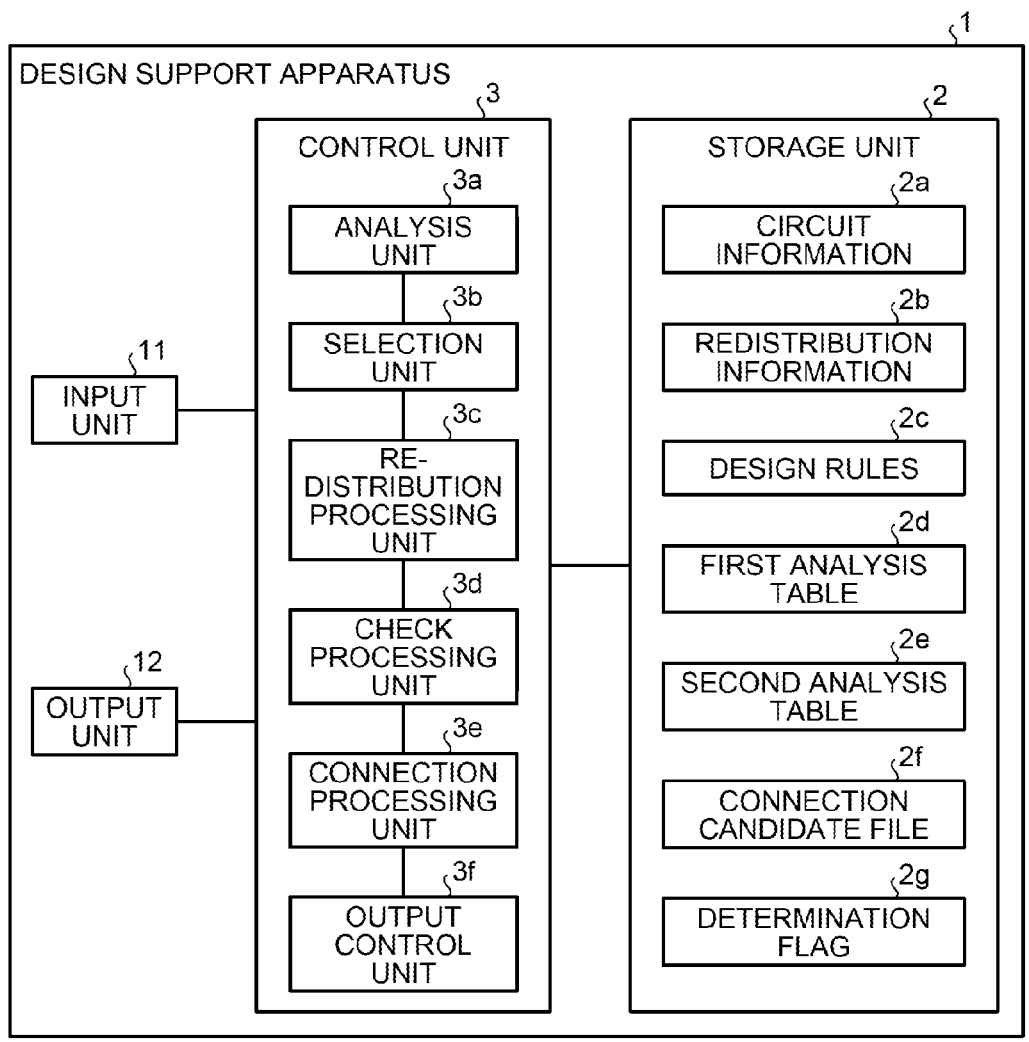
FIG. 1 is a diagram illustrating an example of a functional configuration of a design support apparatus according to an embodiment.

FIG. 1 is a diagram illustrating an example of a functional configuration of the design support apparatus according to the embodiment. As illustrated in the example of FIG. 1, a design support apparatus 1 includes an input unit 11, an output unit 12, a storage unit 2, and a control unit 3. The design support apparatus 1 redistributes an already generated clock tree.

The input unit 11 inputs various pieces of information into the control unit 3. For example, the input unit 11 accepts an instruction to execute a design support process, which is described below, from a user of the design support apparatus 1, and inputs the accepted instruction into the control unit 3. Examples of the user of the design support apparatus 1 include a designer of a semiconductor integrated circuit. Examples of a device of the input unit 11 include a mouse and a keyboard.

The output unit 12 outputs various pieces of information. For example, the output unit 12 displays a semiconductor integrated circuit whose clock tree has been redistributed by the control of an output control unit 3f described below. Examples of a device of the output unit 12 include a liquid crystal display.

The storage unit 2 stores various pieces of information. For example, the storage unit 2 stores circuit information 2a, redistribution information 2b, design rules 2c, a first analysis table 2d, a second analysis table 2e, a connection candidate file 2f, and a determination flag 2g.

The circuit information 2a is data indicating a semiconductor integrated circuit whose clock tree has already been generated. The semiconductor integrated circuit includes a plurality of cells such as flip-flops and latches. The cell operates based on an input clock signal. Moreover, the semiconductor integrated circuit includes a plurality of driving cells such as choppers that input clock signals into the cells such as flip-flops and latches via wiring. Moreover, the semiconductor integrated circuit includes a wire that connects the cell and the driving cell.

Figure 2:
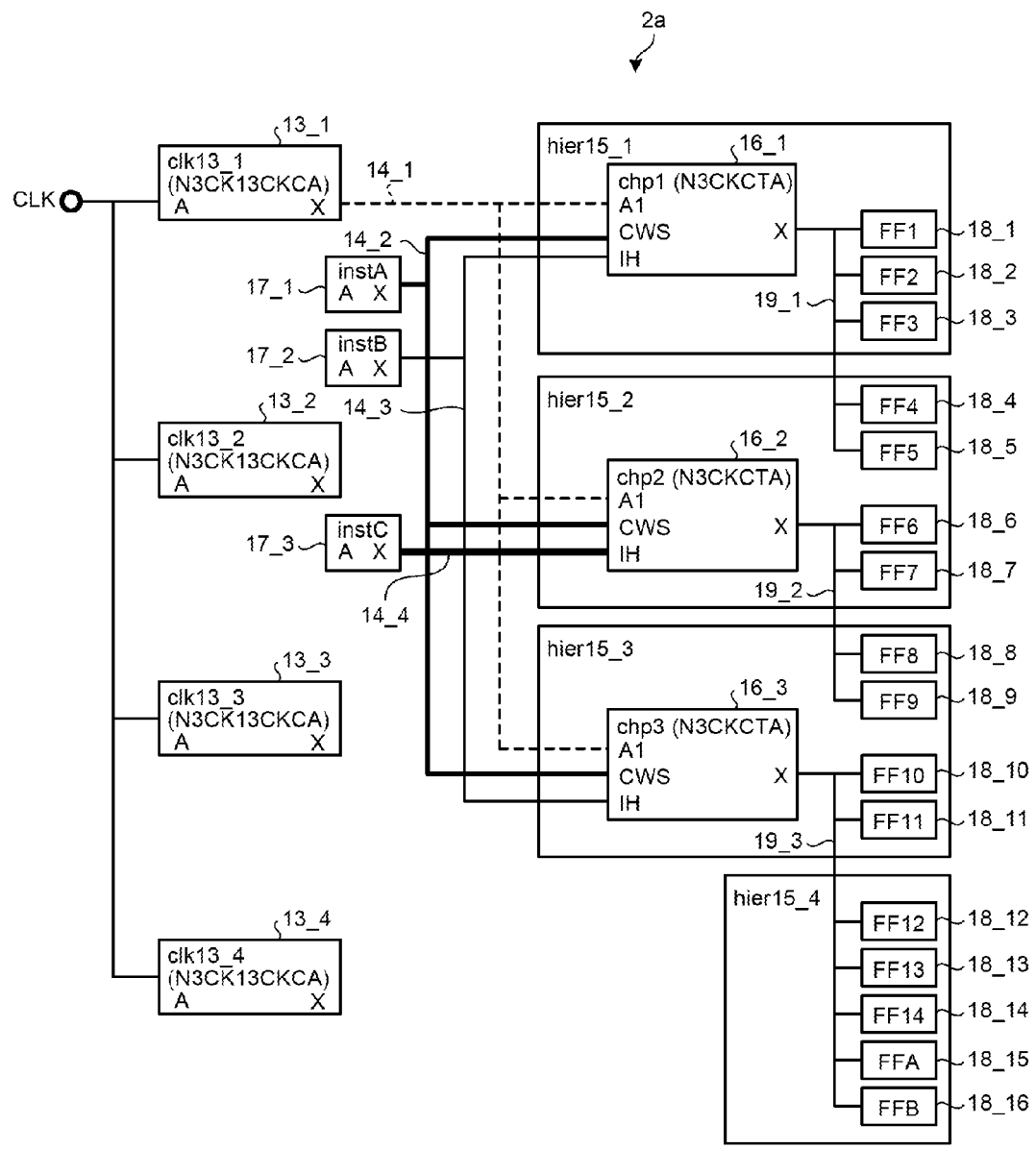
FIG. 2 is a diagram illustrating an example of a semiconductor integrated circuit indicated by circuit information.

FIG. 2 is a diagram illustrating an example of a semiconductor integrated circuit indicated by the circuit information 2a. In the semiconductor integrated circuit illustrated in the example of FIG. 2, the clock signal supplied from an external clock pin CLK is input into an input pin A of a cell 13_1. In the semiconductor integrated circuit illustrated in the example of FIG. 2, the clock signal supplied from the external clock pin CLK is similarly input into input pins A of cells 13_2 to 13_4.

Moreover, in the semiconductor integrated circuit illustrated in the example of FIG. 2, the clock signal output from a clock output pin X of the cell 13_1 is input into a clock input pin A1 of a cell 16_1 in a low hierarchy hier15_1 via a wire 14_1. Moreover, in the semiconductor integrated circuit illustrated in the example of FIG. 2, the clock signal output from the clock output pin X of the cell 13_1 is input into a clock input pin A1 of a cell 16_2 in a low hierarchy hier15_2 via the wire 14_1. Moreover, in the semiconductor integrated circuit illustrated in the example of FIG. 2, the clock signal output from the clock output pin X of the cell 13_1 is input into a clock input pin A1 of a cell 16_3 in a low hierarchy hier15_3 via the wire 14_1. The cells 16_1 to 16_3 are driving cells that input the clock signal into cells connected to their clock output pins X and drive the cells, and are, for example, choppers.

Moreover, in the semiconductor integrated circuit illustrated in the example of FIG. 2, a chop width selection signal output from an output pin X of a cell 17_1 is input into an input pin CWS of the cell 16_1 via a wire 14_2. Moreover, in the semiconductor integrated circuit illustrated in the example of FIG. 2, the chop width selection signal output from the output pin X of the cell 17_1 is input into an input pin CWS of the cell 16_2 via the wire 14_2. Moreover, in the semiconductor integrated circuit illustrated in the example of FIG. 2, the chop width selection signal output from the output pin X of the cell 17_1 is input into an input pin CWS of the cell 16_3 via the wire 14_2.

Moreover, in the semiconductor integrated circuit illustrated in the example of FIG. 2, the clock inhibit signal output from an output pin X of a cell 17_2 is input into an input pin IH of the cell 16_1 via a wire 14_3. Moreover, in the semiconductor integrated circuit illustrated in the example of FIG. 2, the clock inhibit signal output from the output pin X of the cell 17_2 is input into an input pin IH of the cell 16_3 via the wire 14_3.

Moreover, in the semiconductor integrated circuit illustrated in the example of FIG. 2, a clock inhibit signal output from an output pin X of a cell 17_3 is input into an input pin IH of the cell 16_2 via a wire 14_4.

Moreover, in the semiconductor integrated circuit illustrated in the example of FIG. 2, the clock signal output from a clock output pin X of the cell 16_1 is connected to clock input pins of five flip-flops 18_1 to 18_5 via a wire 19_1. Moreover, in the semiconductor integrated circuit illustrated in the example of FIG. 2, the clock signal output from a clock output pin X of the cell 16_2 is connected to clock input pins of four flip-flops 18_6 to 18_9 via a wire 19_2. Moreover, in the semiconductor integrated circuit illustrated in the example of FIG. 2, the clock signal output from a clock output pin X of the cell 16_3 is connected to clock input pins of seven flip-flops 18_10 to 18_16 via a wire 19_3. In the following description, the flip-flop may be expressed as the "cell."

Moreover, the cells 18_1 to 18_16 illustrated in the example of the FIG. 2 operate based on the clock signal input into their clock input pins. In the embodiment, the FFs operating based on the clock signal output from the same driving cell belong to the same group (Group). For example, the cells 18_1 to 18_5 operating based on the clock signal output from the cell 16_1 belong to a group 1. Moreover, the cells 18_6 to 18_9 operating based on the clock signal output from the cell 16_2 belong to a group 2. Moreover, the cells 18_10 to 18_16 operating based on the clock signal output from the cell 16_3 belong to a group 3. The identifier of the group 1 is "1". The identifier of the group 2 is "2". The identifier of the group 3 is "3".

Moreover, the identifiers to identify the cells are described. For example, the identifier of the cell 13_1 illustrated in the example of FIG. 2 is "clk13_1". Similarly, the identifier of the cell 13_2 is "clk13_2", the identifier of the cell 13_3 "clk13_3", and the identifier of the cell 13_4 "clk13_4".

Moreover, the identifier of the cell 16_1 is "chp1", the identifier of the cell 16_2 "chp2", and the identifier of the cell 16_3 "chp3". The identifier of the cell 17_1 is "instA", the identifier of the cell 17_2 "instB", and the identifier of the cell 17_3 "instC".

Moreover, the identifier of the cell 18_1 is "FF1", the identifier of the cell 18_2 "FF2", the identifier of the cell 18_3 "FF3", and the identifier of the cell 18_4 "FF4". Moreover, the identifier of the cell 18_5 is "FF5", the identifier of the cell 18_6 "FF6", the identifier of the cell 18_7 "FF7", and the identifier of the cell 18_8 "FF8". Moreover, the identifier of the cell 18_9 is "FF9", the identifier of the cell 18_10 "FF10", the identifier of the cell 18_11 "FF11", and the identifier of the cell 18_12 "FF12". Moreover, the identifier of the cell 18_13 is "FF13", the identifier of the cell 18_14 "FF14", the identifier of the cell 18_15 "FFA", and the identifier of the cell 18_16 "FFB".

The redistribution information 2b is information indicating the relationship between the FF targeted to change its placement upon the redistribution of the clock tree among the cells 18_1 to 18_16 and a group to which the FF targeted to change its placement belongs after the change of the placement. The redistribution information 2b is created by a designer who designs the circuit.

FIG. 3 is a diagram illustrating an example of the redistribution information. The redistribution information 2b illustrated in FIG. 3 indicates that the cells 18_1 and 18_2 in a low hierarchy hier1, the cell 18_6 in a low hierarchy hier2, and the cell 18_8 in a low hierarchy hier3 belong to a group 1 (group1). Moreover, the redistribution information 2b indicates that the cell 18_3 in the low hierarchy hier1, the cell 18_4 in the low hierarchy hier2, the cells 18_9 and 18_10 in the low hierarchy hier3, and the cell 18_12 in a low hierarchy hier4 belong to a group 2 (group2). Moreover, the redistribution information 2b indicates that the cell 18_5 in the low hierarchy hier2 and the cell 18_14 in the low hierarchy hier4 belong to a group 3 (group3). Moreover, the redistribution information 2b indicates that the cell 18_13 in the low hierarchy hier4 belongs to a group 4 (group4). Moreover, the redistribution information 2b indicates that the cell 18_7 in the low hierarchy hier2 and the cell 18_11 in the low hierarchy hier3 belong to a group 5 (group5). In the redistribution information 2b illustrated in FIG. 3, a group to which the cells 18_15 and 18_16 among the cells 18_1 to 18_16 belong is not defined here. That the group to which the cells 18_15 and 18_16 belong is not defined in the redistribution information 2b means that an upstream cell connected to the cells 18_15 and 18_16 is still the cell 16_3 as illustrated in the previous FIG. 2 after the redistribution of the clock tree. In other words, after the redistribution of the clock tree, the upstream cell connected to the cells 18_15 and 18_16 is still the same as the upstream cell before the redistribution of the clock tree.

The maximum fan-out (MaxFanout), which is used in a design rule (design rule) checking process, is registered in the design rules 2c. Moreover, the library name and location of a library where drivability of the output pins of the driving cells, the capacitance of the input pins of the cells, and the like, which are used in the design rule checking process, are registered are registered in the design rules 2c. FIG. 4 is a diagram illustrating an example of the design rules. The design rules 2c illustrated in FIG. 4 indicate that the maximum fan-out used in the design rule checking process is "8". Moreover, the design rules 2c of FIG. 4 indicate that the library where the drivability of the output pins of the driving cells, the capacitance of the input pins of the cells, and the like are registered is a library named "yy" existing under a folder "xx".

The first analysis table 2d, the second analysis table 2e, the connection candidate file 2f, and the determination flag 2g are described below.

The storage unit 2 is a semiconductor memory device such as flash memory, or a storage device such as a hard disk or an optical disc.

The control unit 3 includes an internal memory for storing a program that specifies various processing procedures, and control data, and executes various processes based on them. As illustrated in FIG. 1, the control unit 3 includes an analysis unit 3a, a selection unit 3b, a redistribution processing unit 3c, a check processing unit 3d, a connection processing unit 3e, and the output control unit 3f.

The analysis unit 3a analyzes various pieces of information. An aspect of the analysis unit 3a is described. For example, the analysis unit 3a acquires the circuit information 2a from the storage unit 2 first when an instruction to execute the design support process is input from the input unit 11. The analysis unit 3a then acquires the design rules 2c from the storage unit 2. The analysis unit 3a then acquires the redistribution information 2b from the storage unit 2.

The analysis unit 3a then analyzes the semiconductor integrated circuit indicated by the acquired circuit information 2a, and the acquired redistribution information 2b, and registers various analysis results in the first analysis table 2d and the second analysis table 2e.

A description is given of examples of processes of the analysis unit 3a's analyzing the semiconductor integrated circuit indicated by the circuit information 2a, and the redistribution information 2b, and registering various analysis results in the first analysis table 2d and the second analysis table 2e. FIGS. 5 and 6 are diagrams illustrating examples of processes to be executed by the analysis unit.

FIG. 5 illustrates an example of a case where the analysis unit 3a makes various analyses and registers various analysis results in the first analysis table 2d. The analysis unit 3a analyzes the semiconductor integrated circuit indicated by the circuit information 2*a* first, identifies the cells such as flip-flops and latches, and registers the identifiers of the identified cells in an item, "ff, latch," of the first analysis table 2*d*. For example, when having acquired the circuit information 2*a* indicating the semiconductor integrated circuit of FIG. 2, the analysis unit 3*a* performs the following process. In other words, the analysis unit 3*a* analyzes the semiconductor integrated circuit of FIG. 2 indicated by the circuit information 2*a*, and identifies 16 flip-flops 18_1 to 18_16. The analysis unit 3*a* then registers the identifiers "FF1" to "FF14", "FFA", and "FFB" of the identified flip-flops 18_1 to 18_16 in the "ff, latch" item of the first analysis table 2*d* as illustrated in FIG. 5.

Moreover, the analysis unit 3*a* analyzes the redistribution information 2*b*, identifies the target cells whose groups are to be reset, and registers "Y" indicating that the identified cells are the target cells whose groups are to be reset in an item, "process target," of the first analysis table 2*d*. For example, when having acquired such redistribution information 2*b* as illustrated in FIG. 3, the analysis unit 3*a* performs the following process. In other words, the analysis unit 3*a* analyzes the redistribution information 2*b* illustrated in FIG. 3, and identifies the cells 18_1 to 18_14 targeted for the group resetting. The analysis unit 3*a* then registers the above-mentioned "Y" in the "process target" item of the first analysis table 2*d* while associating "Y" with each of the identifiers "FF1" to "FF14" of the identified cells 18_1 to 18_14 as illustrated in FIG. 5. The analysis unit 3*a* then identifies the cells 18_15 and 18_16, which are not target cells for the group resetting, among the cells 18_1 to 18_16. As illustrated in FIG. 5, the analysis unit 3*a* then registers "N" indicating that the cells are not the target cells for the group resetting in the "process target" item while associating "N" with each of the identifiers "FFA" and "FFB" of the identified cells 18_15 and 18_16.

Moreover, the analysis unit 3*a* analyzes the semiconductor integrated circuit indicated by the circuit information 2*a*, and identifies the groups to which the cells belong in the semiconductor integrated circuit before a redistribution process, which is a process of redistributing the clock tree and is described below, is performed thereon. The semiconductor integrated circuit indicated by the circuit information 2*a* is a target circuit on which the redistribution process is to be performed and is a circuit before the redistribution process is performed thereon. The analysis unit 3*a* then registers the identifiers of the identified groups in an item, "Group before redistribution," of the first analysis table 2*d*. For example, when having acquired the circuit information 2*a* indicating the semiconductor integrated circuit of FIG. 2, the analysis unit 3*a* performs the following process. In other words, the analysis unit 3*a* analyzes the semiconductor integrated circuit of FIG. 2 indicated by the circuit information 2*a*, and identifies the group 1 to which the cells 18_1 to 18_5 belong in the semiconductor integrated circuit before the redistribution process, which is described below, is performed thereon. Moreover, the analysis unit 3*a* identifies the group 2 to which the cells 18_6 to 18_9 belong. Moreover, the analysis unit 3*a* identifies the group 3 to which the cells 18_10 to 18_16 belong. As illustrated in FIG. 5, the analysis unit 3*a* then registers the identifier "1" of the group 1 in the "Group before redistribution" item while associating the identifier "1" with each of the identifiers "FF1" to "FF5" of the cells 18_1 to 18_5. Moreover, as illustrated in FIG. 5, the analysis unit 3*a* registers the identifier "2" of the group 2 in the "Group before redistribution" item while associating the identifier "2" with each of the identifiers "FF6" to "FF9" of the cells 18_6 to 18_9. Moreover, as illustrated in FIG. 5, the analysis unit 3*a* registers the identifier "3" of the group 3 in the "Group before redistribution" item while associating the identifier "3" with each of the identifiers "FF10" to "FF14", "FFA", and "FFB" of the cells 18_10 to 18_16.

Moreover, the analysis unit 3*a* analyzes the redistribution information 2*b*, and identifies the groups to which the cells belong in the semiconductor integrated circuit after the redistribution process is performed thereon. The analysis unit 3*a* then registers the identifiers of the identified groups in an item, "Group after redistribution," of the first analysis table 2*d*. For example, when having acquired such redistribution information 2*b* as illustrated in FIG. 3, the analysis unit 3*a* performs the following process. In other words, the analysis unit 3*a* analyzes the redistribution information 2*b*, and identifies the group 1 to which the cells 18_1, 18_2, 18_6, and 18_8 belong. Moreover, the analysis unit 3*a* identifies the group 2 to which the cells 18_3, 18_4, 18_9, 18_10, and 18_12 belong. Moreover, the analysis unit 3*a* identifies the group 3 to which the cells 18_5 and 18_14 belong. Moreover, the analysis unit 3*a* identifies the group 4 to which the cell 18_13 belongs. Moreover, the analysis unit 3*a* identifies the group 5 to which the cells 18_7 and 18_11 belong. As illustrated in FIG. 5, the analysis unit 3*a* then registers the identifier "1" of the group 1 in the "Group after redistribution" item while associating the identifier "1" with each of the identifiers "FF1", "FF2", "FF6", and "FF8" of the cells 18_1, 18_2, 18_6, and 18_8. Moreover, as illustrated in FIG. 5, the analysis unit 3*a* performs the following process while establishing associations with the identifiers "FF3", "FF4", "FF9", "FF10", and "FF12" of the cells 18_3, 18_4, 18_9, 18_10, and 18_12. In other words, the analysis unit 3*a* registers the identifier "2" of the group 2 in the "Group after redistribution" item. Moreover, as illustrated in FIG. 5, the analysis unit 3*a* registers the identifier "3" of the group 3 in the "Group after redistribution" item while associating the identifier "3" with each of the identifiers "FF5" and "FF14" of the cells 18_5 and 18_14. Moreover, as illustrated in FIG. 5, the analysis unit 3*a* registers the identifier "4" of the group 4 in the "Group after redistribution" item while associating the identifier "4" with the identifier "FF13" of the cell 18_13. Moreover, as illustrated in FIG. 5, the analysis unit 3*a* registers the identifier "5" of the group 5 in the "Group after redistribution" item while associating the identifier "5" with each of the identifiers "FF7" and "FF11" of the cells 18_7 and 18_11. In the redistribution information 2*b* illustrated in FIG. 3, the group to which the cells 18_15 and 18_16 belong is not defined. Accordingly, as illustrated in FIG. 5, the analysis unit 3*a* registers no entries in the "Group after redistribution" item, the entries corresponding to the cells 18_15 and 18_16.

Moreover, the analysis unit 3*a* analyzes the semiconductor integrated circuit indicated by the circuit information 2*a*, and identifies the driving cell upstream of the cell in the semiconductor integrated circuit before the redistribution process, which is described below, is performed thereon. The analysis unit 3*a* then registers the identifier of the identified driving cell in an item, "upstream cell before redistribution," of the first analysis table 2*d*. For example, when having acquired the circuit information 2*a* indicating the semiconductor integrated circuit of FIG. 2, the analysis unit 3*a* performs the following process. In other words, the analysis unit 3*a* analyzes the semiconductor integrated circuit of FIG. 2 indicated by the circuit information 2*a*, and identifies the cell 16_1 upstream of the cells 18_1 to 18_5. Moreover, the analysis unit 3*a* identifies the cell 16_2 upstream of the cells 18_6 to 18_9. Moreover, the analysis unit 3*a* identifies the cell 16_3 upstream of the cells 18_10 to 18_16. As illustrated in FIG. 5, the analysis unit 3*a* then registers the identifier "chp1" of the identified cell 16_1 in the "upstream cell before redistribution" item while associating the identifier "chp1" with each of the identifiers "FF1" to "FF5" of the cells 18_1 to 18_5. Moreover, as illustrated in FIG. 5, the analysis unit 3a registers the identifier "chp2" of the identified cell 16_2 in the "upstream cell before redistribution" item while associating the identifier "chp2" with each of the identifiers "FF6" to "FF9" of the cells 18_6 to 18_9. Moreover, as illustrated in FIG. 5, the analysis unit 3a registers the identifier "chp3" of the identified cell 16_3 in the "upstream cell before redistribution" item while associating the identifier "chp3" with each of the identifiers "FF10" to "FF14", "FFA", and "FFB" of the cells 18_10 to 18_16.

Moreover, the analysis unit 3a analyzes the redistribution information 2b, and identifies the cell that is not targeted for the group resetting. The analysis unit 3a then analyzes the semiconductor integrated circuit indicated by the circuit information 2a, and identifies the driving cell upstream of the identified cell in the semiconductor integrated circuit after the redistribution process is performed thereon. The cell that is not targeted for the group resetting is not changed in placement before and after the redistribution process. In other words, the driving cell upstream of the identified cell in the semiconductor integrated circuit after the redistribution process is performed thereon is the same driving cell upstream of the identified call in the semiconductor integrated circuit before the redistribution process is performed thereon. Hence, the analysis unit 3a can identify the driving cell upstream of the identified cell in the semiconductor integrated circuit after the redistribution process is performed thereon, from the circuit information 2a indicating the semiconductor integrated circuit before the redistribution process is performed thereon. In other words, the analysis unit 3a can identify the driving cell upstream of the identified cell in the semiconductor integrated circuit after the redistribution process is performed thereon by identifying the driving cell upstream of the identified cell in the semiconductor integrated circuit before the redistribution process is performed thereon, the semiconductor integrated circuit being indicated by the circuit information 2a. The analysis unit 3a then registers the identifier of the identified driving cell in an item, "upstream cell after redistribution," of the first analysis table 2d.

For example, when having acquired the circuit information 2a indicating the semiconductor integrated circuit of FIG. 2 and the redistribution information 2b illustrated in FIG. 3, the analysis unit 3a performs the following process. In other words, the analysis unit 3a analyzes the redistribution information 2b illustrated in FIG. 3, and identifies the cells 18_15 and 18_16 that are not targeted for the group resetting. The analysis unit 3a then analyzes the semiconductor integrated circuit of FIG. 2 indicated by the circuit information 2a, and identifies the cell 16_3 upstream of the cell 18_15 in the semiconductor integrated circuit after the redistribution process is performed thereon. Moreover, the analysis unit 3a identifies the cell 16_3 upstream of the cell 18_16 in the semiconductor integrated circuit after the redistribution process is performed thereon. As illustrated in FIG. 5, the analysis unit 3a then registers the identifier "chp3" of the identified cell 16_3 in the "upstream cell after redistribution" item while associating the identifier "chp3" with each of the identifiers "FFA" and "FFB" of the cells 18_15 and 18_16.

Moreover, the analysis unit 3a identifies the location and name of the library from the contents of the acquired design rules 2c. For example, when having acquired the design rules 2c of FIG. 4, the analysis unit 3a identifies the library where the drivability of the output pins of the driving cells, the capacitance of the input pins of the cells, and the like are registered as the library named "yy" existing under the folder "xx". The analysis unit 3a then acquires the library having the identified library name and existing in the identified location. For example, the analysis unit 3a acquires the library named "yy" existing under the folder "xx". The analysis unit 3a then acquires, from the acquired library, the capacitance of the input pins of the cells registered in the library. The analysis unit 3a then registers the acquired capacitance of the input pin of each cell in an item, "input pin capacitance," of the first analysis table 2d while associating the capacitance with the identifier of the cell. For example, as illustrated in FIG. 5, the analysis unit 3a registers a capacitance "0.336" of the input pin in the "input pin capacitance" item while associating the capacitance "0.336" with the identifier "FF1" of the cell 18_1. As illustrated in FIG. 5, the analysis unit 3a similarly also registers the capacitance of the input pins of the other cells 18_2 to 18_16 in the "input pin capacitance" item while associating the capacitance with the identifiers of the cells.

FIG. 6 illustrates an example of a case where the analysis unit 3a makes various analyses and registers various analysis results in the second analysis table 2e. The analysis unit 3a registers the identifiers of the driving cells in the semiconductor integrated circuit indicated by the circuit information 2a in an item, "identifier," of the second analysis table 2e. For example, when having acquired the circuit information 2a indicating the semiconductor integrated circuit of FIG. 2, the analysis unit 3a performs the following process. In other words, as illustrated in FIG. 6, the analysis unit 3a registers, in the "identifier" item of the second analysis table 2e, the identifiers "chp1" to "chp3" of the cells 16_1 to 16_3 being the driving cells in the semiconductor integrated circuit of FIG. 2 indicated by the circuit information 2a.

Moreover, the analysis unit 3a analyzes the semiconductor integrated circuit indicated by the circuit information 2a, identifies the input pins of the driving cells, and registers the names of the identified input pins in an item, "input pin," of the second analysis table 2e. For example, when having acquired the circuit information indicating the semiconductor integrated circuit of FIG. 2, the analysis unit 3a analyzes the semiconductor integrated circuit of FIG. 2 indicated by the circuit information 2a, and identifies the input pins A1, CWS, and IH of the cell 16_1 being the driving cell. Moreover, the analysis unit 3a identifies the input pins A1, CWS, and IH of the cell 16_2 being the driving cell. Moreover, the analysis unit 3a identifies the input pins A1, CWS, and IH of the cell 16_3 being the driving cell. As illustrated in FIG. 6, the analysis unit 3a then registers names "A1", "CWS", and "IH" of the input pins A1, CWS, and IH of the identified cell 16_1 in the "input pin" item while associating the names "A1", "CWS", and "IH" with the identifier "chp1" of the cell 16_1. Moreover, the analysis unit 3a registers names "A1", "CWS", and "IH" of the input pins A1, CWS, and IH of the identified cell 16_2 in the "input pin" item while associating the names "A1", "CWS", and "IH" with the identifier "chp2" of the cell 16_2. Moreover, the analysis unit 3a registers names "A1", "CWS", and "IH" of the input pins A1, CWS, and IH of the identified cell 16_3 in the "input pin" item while associating the names "A1", "CWS", and "IH" with the identifier "chp3" of the cell 16_3.

Moreover, the analysis unit 3a analyzes the semiconductor integrated circuit indicated by the circuit information 2a, and identifies the drive pin of the cell to which the already identified input pin is connected via a wire. The analysis unit 3a then generates drive pin information indicating the identified drive pin, and registers the generated drive pin information in an item, "drive pin," of the second analysis table 2e. For example, when having acquired the circuit information indicating the semiconductor integrated circuit of FIG. 2, the analysis unit 3a performs the following process. In other words, the analysis unit 3a analyzes the semiconductor integrated circuit of FIG. 2 indicated by the circuit information 2a, and identifies the output pin X being the drive pin of the cell 13_1 to which the already identified input pin A1 of the cell 16_1 is connected via the wire 14_1. The analysis unit 3a then generates drive pin information "clk13_1.X" where the identifier "clk13_1" of the cell 13_1 having the identified output pin X and a name "X" of the identified output pin X are combined with ".". As illustrated in FIG. 6, the analysis unit 3a then registers the generated drive pin information "clk13_1.X" in the "drive pin" item while associating the drive pin information "clk13_1.X" with the name "A1" of the already identified input pin A1 of the cell 16_1.

Moreover, the analysis unit 3a analyzes the semiconductor integrated circuit of FIG. 2 indicated by the circuit information 2a, and identifies the output pin X being the drive pin of the cell 17_1 to which the already identified input pin CWS of the cell 16_1 is connected via the wire 14_2. The analysis unit 3a then generates drive pin information "instA.X" where the identifier "instA" of the cell 17_1 having the identified output pin X and a name "X" of the identified output pin X are combined with ".". As illustrated in FIG. 6, the analysis unit 3a then registers the generated drive pin information "instA.X" in the "drive pin" item while associating the drive pin information "instA.X" with the name "CWS" of the already identified input pin CWS of the cell 16_1.

Moreover, the analysis unit 3a analyzes the semiconductor integrated circuit of FIG. 2 indicated by the circuit information 2a, and identifies the output pin X being the drive pin of the cell 17_2 to which the already identified input pin IH of the cell 16_1 is connected via the wire 14_3. The analysis unit 3a then generates drive pin information "instB.X" where the identifier "instB" of the cell 17_2 having the identified output pin X and a name "X" of the identified output pin X are combined with ".". As illustrated in FIG. 6, the analysis unit 3a then registers the generated drive pin information "instB.X" in the "drive pin" item while associating the drive pin information "instB.X" with the name "IH" of the already identified input pin IH of the cell 16_1.

Moreover, the analysis unit 3a analyzes the semiconductor integrated circuit of FIG. 2 indicated by the circuit information 2a, and identifies the output pin X being the drive pin of the cell 13_1 to which the already identified input pin A1 of the cell 16_2 is connected via the wire 14_1. The analysis unit 3a then generates drive pin information "clk13_1.X" where the identifier "clk13_1" of the cell 13_1 having the identified output pin X and the name "X" of the identified output pin X are combined with ".". As illustrated in FIG. 6, the analysis unit 3a then registers the generated pin information "clk13_1.X" in the "drive pin" item while associating the drive pin information "clk13_1.X" with the name "A1" of the already identified input pin A1 of the cell 16_2.

Moreover, the analysis unit 3a analyzes the semiconductor integrated circuit of FIG. 2 indicated by the circuit information 2a, and identifies the output pin X being the drive pin of the cell 17_1 to which the already identified input pin CWS of the cell 16_2 is connected via the wire 14_2. The analysis unit 3a then generates drive pin information "instA.X" where the identifier "instA" of the cell 17_1 having the identified output pin X and the name "X" of the identified output pin X are combined with ".". As illustrated in FIG. 6, the analysis unit 3a then registers the generated drive pin information "instA.X" in the "drive pin" item while associating the drive pin information "instA.X" with the name "CWS" of the already identified input pin CWS of the cell 16_2.

Moreover, the analysis unit 3a analyzes the semiconductor integrated circuit of FIG. 2 indicated by the circuit information 2a, and identifies the output pin X being the drive pin of the cell 17_3 to which the already identified input pin IH of the cell 16_2 is connected via the wire 14_4. The analysis unit 3a then generates drive pin information "instC.X" where the identifier "instC" of the cell 17_3 having the identified output pin X and a name "X" of the identified output pin X are combined with ".". As illustrated in FIG. 6, the analysis unit 3a then registers the generated drive pin information "instC.X" in the "drive pin" item while associating the drive pin information "instC.X" with the name "IH" of the already identified input pin IH of the cell 16_2.

Moreover, the analysis unit 3a analyzes the semiconductor integrated circuit of FIG. 2 indicated by the circuit information 2a, and identifies the output pin X being the drive pin of the cell 13_1 to which the already identified input pin A1 of the cell 16_3 is connected via the wire 14_1. The analysis unit 3a then generates drive pin information "clk13_1.X" where the identifier "clk13_1" of the cell 13_1 having the identified output pin X and the name "X" of the identified output pin X are combined with ".". As illustrated in FIG. 6, the analysis unit 3a then registers the generated drive pin information "clk13_1.X" in the "drive pin" item while associating the drive pin information "clk13_1.X" with the name "A1" of the already identified input pin A1 of the cell 16_3.

Moreover, the analysis unit 3a analyzes the semiconductor integrated circuit of FIG. 2 indicated by the circuit information 2a, and identifies the output pin X being the drive pin of the cell 17_1 to which the already identified input pin CWS of the cell 16_3 is connected via the wire 14_2. The analysis unit 3a then generates drive pin information "instA.X" where the identifier "instA" of the cell 17_1 having the identified output pin X and the name "X" of the identified output pin X are combined with ".". As illustrated in FIG. 6, the analysis unit 3a then registers the generated drive pin information "instA.X" in the "drive pin" item while associating the drive pin information "instA.X" with the name "CWS" of the already identified input pin CWS of the cell 16_3.

Moreover, the analysis unit 3a analyzes the semiconductor integrated circuit of FIG. 2 indicated by the circuit information 2a, and identifies the output pin X being the drive pin of the cell 17_2 to which the already identified input pin IH of the cell 16_3 is connected via the wire 14_3. The analysis unit 3a then generates drive pin information "instB.X" where the identifier "instB" of the cell 17_2 having the identified output pin X and the name "X" of the identified output pin X are combined with ".". As illustrated in FIG. 6, the analysis unit 3a then registers the generated drive pin information "instB.X" in the "drive pin" item while associating the drive pin information "instB.X" with the name "IH" of the already identified input pin IH of the cell 16_3.

The analysis unit 3a then identifies another driving cell whose drive pin information registered in the "drive pin" item is all agreed with the driving cell indicated by the identifier registered in the "identifier" item of the second analysis table 2e. The analysis unit 3a then registers the identifier of the identified another driving cell in an item, "same connections to all input pins," of the second analysis table 2e. For example, as illustrated in the example of FIG. 6, when the drive pin information has been registered in the "drive pin" item, the analysis unit 3a performs the following process on the cell 16_1 indicated by the identifier "chp1" registered in the "identifier" item. In other words, the analysis unit 3a identifiers another cell 16_3 (the cell indicated by the identifier "chp3") whose drive pin information ("clk13_1.X", "instA.X", and "instB.X") registered in the "drive pin" item agrees. As illustrated in FIG. 6, the analysis unit 3*a* then registers the identifier "chp3" of the identified another cell 16_3 in the "same connections to all input pins" item while associating the identifier "chp3" with the identifier "chp1" of the cell 16_1.

Moreover, the analysis unit 3*a* performs the following process on the cell 16_3 indicated by the identifier "chp3" registered in the "identifier" item. In other words, the analysis unit 3*a* identifiers another cell 16_1 (the cell indicated by the identifier "chp1") whose drive pin information ("clk13_1.X", "instA.X", and "instB.X") registered in the "drive pin" item agrees. As illustrated in FIG. 6, the analysis unit 3*a* then registers the identifier "chp1" of the identified another cell 16_1 in the "same connections to all input pins" item while associating the identifier "chp1" with the identifier "chp3" of the cell 16_3.

The cells where the same signals are input into their input pins are interchangeable upon the redistribution of the clock tree. Therefore, the analysis unit 3*a* registers the identifier of the interchangeable driving cell in the "same connections to all input pins" item in the above-described manner.

Moreover, the analysis unit 3*a* analyzes the semiconductor integrated circuit indicated by the circuit information 2*a*, and identifies the cell connected to the driving cell in the semiconductor integrated circuit before the redistribution process, which is described below, is performed thereon. The analysis unit 3*a* then registers the identifier of the identified cell in an item, "connected latch, ff before redistribution," of the second analysis table 2*e*. For example, when having acquired the circuit information 2*a* indicating the semiconductor integrated circuit of FIG. 2, the analysis unit 3*a* performs the following process. In other words, the analysis unit 3*a* analyzes the semiconductor integrated circuit of FIG. 2 indicated by the circuit information 2*a*, and identifies the cells 18_1 to 18_5 connected to the cell 16_1. Moreover, the analysis unit 3*a* identifies the cells 18_6 to 18_9 connected to the cell 16_2. Moreover, the analysis unit 3*a* identifies the cells 18_10 to 18_16 connected to the cell 16_3. As illustrated in FIG. 6, the analysis unit 3*a* then registers the identifiers "FF1" to "FF5" of the identified cells 18_1 to 18_5 in the "connected latch, ff before redistribution" item while associating the identifiers "FF1" to "FF5" with the identifier "chp1" of the cell 16_1. Moreover, as illustrated in FIG. 6, the analysis unit 3*a* registers the identifiers "FF6" to "FF9" of the identified cells 18_6 to 18_9 in the "connected latch, ff before redistribution" item while associating the identifiers "FF6" to "FF9" with the identifier "chp2" of the cell 16_2. Moreover, as illustrated in FIG. 6, the analysis unit 3*a* registers the identifiers "FF10" to "FF14", "FFA", and "FFB" of the identified cells 18_10 to 18_16 in the "connected latch, ff before redistribution" item while associating the identifiers "FF10" to "FF14", "FFA", and "FFB" with the identifier "chp3" of the cell 16_3.

Moreover, the analysis unit 3*a* identifies the driving cell upstream of the cell that is not targeted for the group resetting in the semiconductor integrated circuit before the redistribution process is performed thereon. The analysis unit 3*a* then identifies a record of the second analysis table 2*e*, where the identifier of the identified driving cell is registered. The analysis unit 3*a* then registers the identifier of the cell that is not targeted for the group resetting in an item, "connected latch, ff after redistribution," of the identified record. Consequently, the identifier of the cell that is still connected to the driving cell in the semiconductor integrated circuit after the redistribution process is performed thereon, among the cells connected to the driving cell in the semiconductor integrated circuit before the redistribution process is performed thereon, is registered in the "connected latch, ff after redistribution" item.

Moreover, the analysis unit 3*a* performs the following process when the identifier of the cell is registered in the "connected latch, ff after redistribution" item. In other words, the analysis unit 3*a* registers, in an item, "output pin fanout," the number of cells whose identifiers are registered in the "connected latch, ff after redistribution" item as the fan-out of the driving cell indicated by the identifier registered in the "identifier" item. On the other hand, the analysis unit 3*a* performs the following process when the identifier of the cell is not registered in the "connected latch, ff after redistribution" item and the identifier of the cell is registered in the "connected latch, ff before redistribution" item. In other words, the analysis unit 3*a* registers, in the "output pin fanout" item, the number of cells whose identifiers are registered in the "connected latch, ff before redistribution" item as the fan-out of the driving cell indicated by the identifier registered in the "identifier" item.

For example, as illustrated in the example of FIG. 6, the analysis unit 3*a* performs the following process when the identifier is registered in both the "connected latch, ff before redistribution" item and the "connected latch, ff after redistribution" item, or the "connected latch, ff before redistribution" item. In other words, the analysis unit 3*a* registers, in the "output pin fanout" item, the number of cells whose identifiers are registered in the "connected latch, ff before redistribution" item, "5", as the fan-out of the cell 16_1 indicated by the identifier "chp1" registered in the "identifier" item. Moreover, the analysis unit 3*a* registers, in the "output pin fanout" item, the number of cells whose identifiers are registered in the "connected latch, ff before redistribution" item, "4", as the fan-out of the cell 16_2 indicated by the identifier "chp2" registered in the "identifier" item. Moreover, the analysis unit 3*a* registers, in the "output pin fanout" item, the number of cells whose identifiers are registered in the "connected latch, ff after redistribution" item, "2", as the fan-out of the cell 16_3 indicated by the identifier "chp3" registered in the "identifier" item.

Moreover, the analysis unit 3*a* acquires, from the acquired library, the drivability of the output pins of the driving cells registered in the library. The analysis unit 3*a* then registers the acquired drivability of each driving cell in an item, "output pin drivability," of the second analysis table 2*e* while associating the drivability with the identifier of the driving cell. For example, as illustrated in FIG. 6, the analysis unit 3*a* registers drivability "3.883" of the output pin in the "output pin drivability" item while associating the drivability "3.883" with the identifier "chp1" of the cell 16_1. As illustrated in FIG. 6, the analysis unit 3*a* similarly also registers the drivability of the output pins of the other cells 16_2 and 16_3 in the "output pin drivability" item while associating the drivability with the identifiers of the driving cells.

The selection unit 3*b* selects a process target cell. An aspect of the selection unit 3*b* is described. For example, the selection unit 3*b* executes the redistribution process described below when the analysis unit 3*a* has registered various analysis results in the first analysis table 2*d* and the second analysis table 2*e*.

In other words, in the redistribution process, the selection unit 3*b* first selects the groups indicated by the redistribution information 2*b*, one by one. For example, when the content of the redistribution information 2*b* is such content as illustrated in FIG. 3, the selection unit 3*b* selects unselected groups, one by one, from the groups 1 to 5.

The selection unit 3b then selects the cells belonging to the selected group, one by one, as the process target cells whenever selecting one group. For example, when the group 1 is selected in the example of FIG. 3, the cells 18_1, 18_2, 18_6, and 18_8 that belong to the group 1 are selected, one by one, as the process target cells.

The selection unit 3b selects all the cells indicated by the redistribution information 2b, one by one, as the process target cells in the above-mentioned method.

The redistribution processing unit 3c executes various processes of redistributing the clock tree. An aspect of the redistribution processing unit 3c is described. For example, whenever the selection unit 3b selects the cell, the redistribution processing unit 3c refers to the first analysis table 2d, and performs the following process. In other words, the redistribution processing unit 3c acquires the identifier of the driving cell (the identifier of a first driving cell) registered in "upstream cell before redistribution" of the record where the identifier of the selected cell is registered in the "ff, latch" item. The redistribution processing unit 3c then refers to the second analysis table 2e, and determines whether or not the identifier of another driving cell (the identifier of a second driving cell) is registered in the "same connections to all input pins" item of the record where the acquired identifier of the first driving cell is registered in the "identifier" item.

If the identifier of another driving cell (the identifier of the second driving cell) is registered in the "same connections to all input pins" item, the redistribution processing unit 3c acquires the identifier of the another driving cell (the identifier of the second driving cell).

If it is determined that the identifier of another driving cell (the identifier of the second driving cell) is not registered in the "same connections to all input pins" item, or if the identifier of the second driving cell is acquired, the redistribution processing unit 3c performs the following process. In other words, the redistribution processing unit 3c refers to the second analysis table 2e, and determines whether or not the identifier of the cell (the identifier of a first cell) is registered in the "connected latch, ff after redistribution" item of the record where the identifier of the first driving cell is registered in the "identifier" item.

If the identifier of the cell (the identifier of the first cell) is registered in the "connected latch, ff after redistribution" item, the redistribution processing unit 3c acquires the identifier of the cell (the identifier of the first cell) registered in the "connected latch, ff after redistribution" item.

Moreover, when having acquired the identifier of the second driving cell, the redistribution processing unit 3c refers to the second analysis table 2e and performs the following process. In other words, the redistribution processing unit 3c determines whether or not the identifier of the cell (the identifier of a second cell) is registered in the "connected latch, ff after redistribution" item of the record where the identifier of the second driving cell is registered in the "identifier" item.

If the identifier of the cell (the identifier of the second cell) is registered in the "connected latch, ff after redistribution" item, the redistribution processing unit 3c acquires the identifier of the cell (the identifier of the second cell) registered in the "connected latch, ff after redistribution" item.

The redistribution processing unit 3c then refers to the redistribution information 2b, and determines whether or not there is another cell that belongs to the same group as the group to which the cell selected by the selection unit 3b belongs. If there is another cell, the redistribution processing unit 3c identifies the another cell.

When having acquired the identifiers of the first and second cells, the redistribution processing unit 3c determines whether or not the identifier of the identified another cell is included in the identifiers of the first and second cells. In this manner, the redistribution processing unit 3c determines whether or not the cells connected by the connection processing unit 3e, which is described below, to the driving cell upstream of the selected cell before the redistribution of the clock tree and the driving cell having the same input signals belong to the same group as the selected cell. If having determined that the identifier of the identified another cell is included in the acquired identifiers of the first and second cells, the redistribution processing unit 3c determines as follows. In other words, the redistribution processing unit 3c determines that the cells connected to the driving cell upstream of the cell selected by the selection unit 3b before the redistribution of the clock tree and the driving cell having the same input signals belong to the same group as the selected cell. On the other hand, if having determined that the identifier of the identified another cell is not included in the acquired identifiers of the first and second cells, the redistribution processing unit 3c determines as follows. In other words, the redistribution processing unit 3c determines that the cells connected to the driving cell having the same input signal as the driving cell upstream of the cell selected by the selection unit 3b before the redistribution of the clock tree does not belong to the same group as the selected cell.

Moreover, if having acquired the identifier of the first cell among the identifiers of the first and second cells, the redistribution processing unit 3c determines whether or not the identifier of the identified another cell is included in the identifier of the first cell. In this manner, the redistribution processing unit 3c determines whether or not the cells connected by the connection processing unit 3e, which is described below, to the driving cell upstream of the selected cell before the redistribution of the clock tree and the driving cell having the same input signals belong to the same group as the selected cell. If having determined that the identifier of the identified another cell is included in the acquired identifier of the first cell, the redistribution processing unit 3c determines as follows. In other words, the redistribution processing unit 3c determines that the cells connected to the driving cell upstream of the cell selected by the selection unit 3b before the redistribution of the clock tree and the driving cell having the same input signals belong to the same group as the selected cell. On the other hand, if having determined that the identifier of the identified another cell is not included in the acquired identifier of the first cell, the redistribution processing unit 3c determines as follows. In other words, the redistribution processing unit 3c determines that the cells connected to the driving cell having the same input signal as the driving cell upstream of the cell selected by the selection unit 3b before the redistribution of the clock tree do not belong to the same group as the selected cell.

Moreover, if having acquired the identifier of the second cell among the identifiers of the first and second cells, the redistribution processing unit 3c determines whether or not the identifier of the identified another cell is included in the identifier of the second cell. In this manner, the redistribution processing unit 3c determines whether or not the cells connected by the connection processing unit 3e, which is described below, to the driving cell upstream of the selected cell before the redistribution of the clock tree and the driving cell having the same input signals belong to the same group as the selected cell. If having determined that the identifier of the identified another cell is included in the acquired identifier of the second cell, the redistribution processing unit 3c determines as follows. In other words, the redistribution processing unit 3c determines that the cells connected to the driving cell upstream of the cell selected by the selection unit 3*b* before the redistribution of the clock tree and the driving cell having the same input signals belong to the same group as the selected cell. On the other hand, if having determined that the identifier of the identified another cell is not included in the acquired identifier of the second cell, the redistribution processing unit 3*c* determines as follows. In other words, the redistribution processing unit 3*c* determines that the cells connected to the driving cell having the same input signal as the driving cell upstream of the cell selected by the selection unit 3*b* before the redistribution of the clock tree do not belong to the same group as the selected cell.

If having determined that the identifier of the identified another cell is included in the identifier of the first or second cell, the redistribution processing unit 3*c* performs the following process. In other words, the redistribution processing unit 3*c* registers the identifier of the driving cell upstream of the identified another cell in the connection candidate file 2*f*.

On the other hand, in predetermined cases, the redistribution processing unit 3*c* refers to the second analysis table 2*e* and makes the following determination. In other words, the redistribution processing unit 3*c* determines whether or not the identifier of the cell (the identifier of the first cell) is registered in the "connected latch, ff after redistribution" item of the record where the identifier of the first driving cell is registered in the "identifier" item. The predetermined cases here include three cases. The first case is a case where the redistribution processing unit 3*c* has acquired neither the identifier of the first cell nor the identifier of the second cell. The second case is a case where the redistribution processing unit 3*c* determines that there is no other cell that belongs to the same group as the group to which the cell selected by the selection unit 3*b* belongs. The third case is a case where the redistribution processing unit 3*c* determines that the identifier of the identified another cell is not included in at least one of the acquired identifiers of the first and second cells.

Consequently, the redistribution processing unit 3*c* can determine whether or not the cell upstream of the selected cell before the redistribution of the clock tree is connected to another cell. If having determined that the identifier of the cell (the identifier of the first cell) is registered in the "connected latch, ff after redistribution" item of the record where the identifier of the first driving cell is registered in the "identifier" item, the redistribution processing unit 3*c* determines as follows. In other words, the redistribution processing unit 3*c* determines that the cell upstream of the selected cell before the redistribution of the clock tree is connected to another cell. On the other hand, if having determined that the identifier of the cell (the identifier of the first cell) is not registered in the "connected latch, ff after redistribution" item of the record where the identifier of the first driving cell is registered in the "identifier" item, the redistribution processing unit 3*c* determines as follows. In other words, the redistribution processing unit 3*c* determines that the cell upstream of the selected cell before the redistribution of the clock tree is not connected to another cell.

If having determined that the identifier of the cell (the identifier of the first cell) is not registered in the "connected latch, ff after redistribution" item of the record where the identifier of the first driving cell is registered in the "identifier" item, the redistribution processing unit 3*c* performs the following process. In other words, the redistribution processing unit 3*c* registers the identifier of the cell (the identifier of the first driving cell) upstream of the selected cell before the redistribution of the clock tree in the connection candidate file 2*f*. The redistribution processing unit 3*c* then transmits, to the check processing unit 3*d*, an instruction to execute the design rule checking process. Consequently, the check processing unit 3*d* executes the design rule checking process.

After the check processing unit 3*d* executes the design rule checking process, the redistribution processing unit 3*c* determines whether or not the value of the determination flag 2*g*, which is described below, is "1" to determine whether or not various design rules are satisfied. If the value of the determination flag 2*g*, which is described below, is not "1", that is, "0", the design rules are not satisfied. Accordingly, the redistribution processing unit 3*c* deletes the identifier of the driving cell registered in the connection candidate file 2*f*. The redistribution processing unit 3*c* then copies the cell (the first driving cell) upstream of the selected cell before the redistribution of the clock tree. The redistribution processing unit 3*c* then registers the identifier of the copied cell in the connection candidate file 2*f*.

On the other hand, if having determined that the identifier of the cell (the identifier of the first cell) is registered in the "connected latch, ff after redistribution" item of the record where the identifier of the first driving cell is registered in the "identifier" item, the redistribution processing unit 3*c* performs the following process. In other words, the redistribution processing unit 3*c* copies the cell (the first driving cell) upstream of the selected cell before the redistribution of the clock tree. The redistribution processing unit 3*c* then registers the identifier of the copied cell in the connection candidate file 2*f*.

The check processing unit 3*d* checks the various design rules. An aspect of the check processing unit 3*d* is described. For example, when having accepted the instruction to execute the design rule checking process transmitted from the redistribution processing unit 3*c*, the check processing unit 3*d* registers "null" in the determination flag 2*g* first and initializes the determination flag 2*g*. The check processing unit 3*d* then acquires the identifier of the driving cell registered in the connection candidate file 2*f*.

The check processing unit 3*d* then acquires the drivability of the output pin of the driving cell indicated by the acquired identifier, from the "output pin drivability" item of the second analysis table 2*e*. Moreover, assuming that the selected cell is connected to the driving cell indicated by the acquired identifier, the check processing unit 3*d* performs the following process. In other words, the check processing unit 3*d* acquires the capacitance of the input pins of all the cells connected to the output pin of the driving cell indicated by the acquired identifier, from the "input pin capacitance" item of the first analysis table 2*d*, and calculates the sum total of the acquired capacitance of the input pins. The check processing unit 3*d* then determines whether or not the acquired drivability of the output pin of the driving cell is equal to or more than the calculated sum total of the capacitance of the input pins. If the acquired drivability of the output pin of the driving cell is not equal to or more than the calculated sum total of the capacitance of the input pins, the check processing unit 3*d* registers, in the determination flag 2*g*, "0" indicating to be against the design rules.

On the other hand, if the acquired drivability of the output pin of the driving cell is equal to or more than the calculated sum total of the capacitance of the input pins, the check processing unit 3*d* performs the following process. In other words, the check processing unit 3*d* acquires the maximum fan-out registered in the design rules 2*c*. The check processing unit 3*d* then acquires the fan-out of the driving cell indicated by the acquired identifier, from the "output pin fanout" item of the second analysis table 2*e*. The check processing unit 3*d* then determines whether or not the fan-out of the driving cell indicated by the acquired identifier is equal to or less than the number obtained by subtracting one from the acquired maximum fan-out (the maximum fan-out−1). If the maximum fan-out of the driving cell indicated by the acquired identifier is not equal to or less than (the maximum fan-out−1), the check processing unit 3d registers, in the determination flag 2g, "0" indicating to be against the design rules.

On the other hand, if the fan-out of the driving cell indicated by the acquired identifier is equal to or less than (the maximum fan-out−1), the check processing unit 3d performs the following process. In other words, the check processing unit 3d determines whether or not the skew of all the cells connected to the driving cell indicated by the acquired identifier meets a predetermined standard, assuming that the selected cell is connected to the driving cell indicated by the acquired identifier. If having determined that the predetermined standard is not met, the check processing unit 3d registers, in the determination flag 2g, "0" indicating to be against the design rules, and ends the design rule checking process.

On the other hand, if having determined that the predetermined standard is met, the check processing unit 3d registers, in the determination flag 2g, "1" indicating to be not against the design rules, and ends the design rule checking process.

The connection processing unit 3e connects the driving cell and the cell. An aspect of the connection processing unit 3e is described. The connection processing unit 3e generates information that the driving cell indicated by the identifier registered in the connection candidate file 2f is connected to the cell selected by the selection unit 3b, and adds the generated information to the circuit information 2a. Consequently, the semiconductor integrated circuit indicated by the circuit information 2a represents a state where the driving cell and the cell, which are indicated by the added information, are connected. The connection processing unit 3e then registers the identifier registered in the connection candidate file 2f in the "upstream cell after redistribution" item of the record of the first analysis table 2d, where the identifier of the cell selected by the selection unit 3b is registered in the "ff, latch" item. The connection processing unit 3e then registers the identifier of the cell selected by the selection unit 3b in the "connected latch, ff after redistribution" item of the record of the second analysis table 2e, where the identifier registered in the connection candidate file 2f is registered in the "identifier" item. Moreover, the connection processing unit 3e registers the identifier of the group to which the cell selected by the selection unit 3b belongs (the group indicated by the redistribution information 2b) in the "connected Group after redistribution" item of the record. Moreover, the connection processing unit 3e increments by one the numerical value registered in the "output pin fanout" item of the record. The connection processing unit 3e then deletes the identifier of the driving cell registered in the connection candidate file 2f.

The output control unit 3f performs control in such a manner as to output various pieces of information. For example, if the selection unit 3b determines that there is no unselected group, the output control unit 3f controls the output unit 12 to display the semiconductor integrated circuit indicated by the circuit information 2a, the semiconductor integrated circuit having the redistributed clock tree.

The control unit 3 is a circuit such as an ASIC (Application Specific Integrated Circuit), an FPGA (Field Programmable Gate Array), a CPU (Central Processing Unit), or an MPU (Micro Processing Unit).

Examples of the processes to be executed by the above-mentioned selection unit 3b, check processing unit 3d, and connection processing unit 3e are described here. FIG. 7 is a diagram illustrating an example of the first analysis table used in the processes. FIG. 8 is a diagram illustrating an example of the second analysis table used in the processes.

As illustrated in the example of FIG. 7, if the selection unit 3b selects the cell 18_1 belonging to the group 1 as the process target cell, the redistribution processing unit 3c performs the following process. In other words, the redistribution processing unit 3c refers to the first analysis table 2d illustrated in FIG. 7, and acquires the identifier "chp1" of the driving cell registered in "upstream cell before redistribution" of the record where the identifier "FF1" of the selected cell 18_1 is registered in the "ff, latch" item. The redistribution processing unit 3c then refers to the second analysis table 2e illustrated in FIG. 8, and acquires the identifier "chp3" of another driving cell registered in the "same connections to all input pins" item of the record where the identifier "chp1" of the driving cell is registered in the "identifier" item. The redistribution processing unit 3c then refers to the second analysis table 2e, and determines whether or not the identifier of the cell (the identifier of the first cell) is registered in the "connected latch, ff after redistribution" item of the record where the identifier "chp1" of the driving cell is registered in the "identifier" item. Since the identifier of the cell (the identifier of the first cell) is not registered in the "connected latch, ff after redistribution" item of the record where the identifier "chp1" of the driving cell is registered in the "identifier" item, the redistribution processing unit 3c does not acquire the identifier of the first cell.

Moreover, having acquired the identifier "chp3" of the driving cell, the redistribution processing unit 3c refers to the second analysis table 2e and performs the following process. In other words, the redistribution processing unit 3c determines whether or not the identifier of the cell (the identifier of the second cell) is registered in the "connected latch, ff after redistribution" item of the record where the identifier "chp3" of the driving cell is registered in the "identifier" item. In the case of FIG. 8, the redistribution processing unit 3c determines that the identifiers "FFA" and "FFB" of the cells (the identifiers of the second cells) are registered in the "connected latch, ff after redistribution" item of the record where the identifier "chp3" of the driving cell is registered in the "identifier" item. Hence, the redistribution processing unit 3c acquires the identifiers "FFA" and "FFB" of the second cells.

The redistribution processing unit 3c then refers to the redistribution information 2b illustrated in FIG. 3, and determines whether or not there is another cell that belongs to the same group as the group to which the cell 18_1 selected by the selection unit 3b belongs. In the case of FIG. 3, there are the other cells 18_2, 18_6, and 18_8. Accordingly, the redistribution processing unit 3c identifies the other cells 18_2, 18_6, and 18_8.

Having acquired the identifiers "FFA" and "FFB" of the second cells among the identifiers of the first and second cells, the redistribution processing unit 3c then performs the following process. In other words, the redistribution processing unit 3c determines whether or not the identifiers "FF2", "FF6", and "FF8" of the identified other cells 18_2, 18_6, and 18_8 are included in the identifiers "FFA" and "FFB" of the second cells. In this case, the redistribution processing unit 3c determines that the identifiers "FF2", "FF6", and "FF8" of the other cells 18_2, 18_6, and 18_8 are not included in the identifiers "FFA" and "FFB" of the second cells. In other words, the redistribution processing unit 3c determines that the cells connected to the driving cell upstream of the cell selected by the selection unit 3b before the redistribution of the clock tree and the driving cell having the same input signals do not belong to the same group as the selected cell.

Hence, the redistribution processing unit 3c refers to the second analysis table 2e, and determines whether or not the identifier of the cell is registered in the "connected latch, ff after redistribution" item of the record where the identifier "chp1" of the driving cell is registered in the "identifier" item. Since the identifier of the cell (the identifier of the first cell) is not registered in the "connected latch, ff after redistribution" item of the record where the identifier "chp1" of the driving cell is registered in the "identifier" item, the redistribution processing unit 3c performs the following process. In other words, the redistribution processing unit 3c registers, in the connection candidate file 2f, the identifier "chp1" of the cell upstream of the selected cell 18_1 before the redistribution of the clock tree. The redistribution processing unit 3c then transmits, to the check processing unit 3d, an instruction to execute the design rule checking process.

When having accepted the instruction to execute the design rule checking process transmitted from the redistribution processing unit 3c, the check processing unit 3d registers "null" in the determination flag 2g first and initializes the determination flag 2g. The check processing unit 3d then acquires the identifier "chp1" of the driving cell registered in the connection candidate file 2f.

The check processing unit 3d then acquires the drivability "3.883" of the output pin X of the cell 16_1 indicated by the acquired identifier "chp1", from the "output pin drivability" item of the second analysis table 2e. Moreover, assuming that the selected cell 18_1 is connected to the cell 16_1 indicated by the acquired identifier "chp1", the check processing unit 3d performs the following process. In other words, the check processing unit 3d acquires the capacitance of the input pin of the cell 18_1 that is all that is connected to the output pin X of the cell 16_1 indicated by the acquired identifier "chp1" from the "input pin capacitance" item of the first analysis table 2d, and calculates the sum total of the acquired capacitance of the input pin. In other words, the check processing unit 3d calculates the sum total "0.336" of the acquired input pin. The check processing unit 3d then determines that the acquired drivability "3.883" of the output pin of the driving cell is equal to or more than the calculated sum total "0.336" of the capacitance of the input pin.

Having determined that the acquired drivability "3.883" of the output pin of the driving cell is equal to or more than the calculated sum total "0.336" of the capacitance of the input pin, the check processing unit 3d performs the following process. In other words, the check processing unit 3d acquires the maximum fan-out, "8", registered in the design rules 2c illustrated in FIG. 4. The check processing unit 3d then acquires the fan-out, "0", of the cell 16_1 indicated by the acquired identifier "chp1", from the "output pin fanout" item of the second analysis table 2e. In the embodiment, it is assumed that "0" is registered in the "output pin fanout" item if there is nothing registered in the "output pin fanout" item. The check processing unit 3d then determines that the fan-out, "0", of the cell 16_1 indicated by the acquired identifier "chp1" is equal to or less than "7" (the maximum fan-out "8"−"1"). Having determined that the fan-out, "0", of the cell 16_1 indicated by the acquired identifier "chp1" is equal to or less than "7", the check processing unit 3d performs the following process. In other words, the check processing unit 3d determines whether or not the skew of the cell 18_1 that is all that is connected to the cell 16_1 indicated by the identifier "chp1" meets the predetermined standard, assuming that the selected cell 18_1 is connected to the cell 16_1 indicated by the acquired identifier "chp1". It is assumed here that the check processing unit 3d has determined that the predetermined standard is met. Hence, the check processing unit 3d registers, in the determination flag 2g, "1" indicating to be not against the design rules.

The redistribution processing unit 3c then determines whether or not the value of the determination flag 2g is "1" to determine whether or not the various design rules are satisfied. If the redistribution processing unit 3c determines that the value of the determination flag 2g is "1", the connection processing unit 3e performs the following process. In other words, the connection processing unit 3e generates information that the driving cell 16_1 indicated by the identifier "chp1" registered in the connection candidate file 2f is connected to the cell 18_1 selected by the selection unit 3b, and adds the generated information to the circuit information 2a. Consequently, the semiconductor integrated circuit indicated by the circuit information 2a represents a state where the cells 16_1 and 18_1, which are indicated by the added information, are connected. The connection processing unit 3e then registers the following identifier in the "upstream cell after redistribution" item of the record of the first analysis table 2d, where the identifier "FF1" of the cell 18_1 selected by the selection unit 3b is registered in the "ff, latch" item as illustrated in FIG. 9. In other words, the connection processing unit 3e registers the identifier "chp1" registered in the connection candidate file 2f in the "upstream cell after redistribution" item. The connection processing unit 3e then registers the following identifier in the "connected latch, ff after redistribution" item of the record of the second analysis table 2e, where the identifier "chp1" registered in the connection candidate file 2f is registered in the "identifier" item as illustrated in FIG. 10. In other words, the connection processing unit 3e registers the identifier "FF1" of the selected cell 18_1 in the "connected latch, ff after redistribution" item. Moreover, the connection processing unit 3e registers the identifier "1" of the group 1 to which the selected cell 18_1 belongs (the group indicated by the redistribution information 2b) in the "connected Group after redistribution" of the record as illustrated in FIG. 10. Moreover, the connection processing unit 3e increments by one the numerical value registered in the "output pin fanout" item of the record as illustrated in FIG. 10. The connection processing unit 3e then deletes the identifier of the driving cell registered in the connection candidate file 2f. FIG. 9 is a diagram illustrating an example of the first analysis table used in the processes. FIG. 10 is a diagram illustrating an example of the second analysis table used in the processes.

Next, as illustrated in the example of FIG. 9, if the selection unit 3b selects the cell 18_2 belonging to the group 1 as the process target cell, the redistribution processing unit 3c performs the following process. In other words, the redistribution processing unit 3c refers to the first analysis table 2d illustrated in FIG. 9, and acquires the identifier "chp1" of the driving cell registered in "upstream cell before redistribution" of the record where the identifier "FF2" of the selected cell 18_2 is registered in the "ff, latch" item. The redistribution processing unit 3c then refers to the second analysis table 2e illustrated in FIG. 10, and acquires the identifier "chp3" of another driving cell registered in the "same connections to all input pins" item of the record where the identifier "chp1" of the driving cell is registered in the "identifier" item. The redistribution processing unit 3c then refers to the second analysis table 2e, and determines whether or not the identifier of the cell (the identifier of the first cell) is registered in the "connected latch, ff after redistribution" item of the record where the identifier "chp1" of the driving cell is registered in the "identifier" item. In the case of FIG. 10, the redistribution processing unit 3c determines that the identifier "FF1" of the cell (the identifier of the first cell) is registered in the "connected latch, ff after redistribution" item of the record where the identifier "chp1" is registered in the "identifier" item. Hence, the redistribution processing unit 3c acquires the identifier "FF1" of the first cell.

Moreover, having acquired the identifier "chp3" of the driving cell, the redistribution processing unit 3c refers to the second analysis table 2e and performs the following process. In other words, the redistribution processing unit 3c determines whether or not the identifier of the cell (the identifier of the second cell) is registered in the "connected latch, ff after redistribution" item of the record where the identifier "chp3" of the driving cell is registered in the "identifier" item. In the case of FIG. 10, the redistribution processing unit 3c determines that the identifiers "FFA" and "FFB" of the cells (the identifiers of the second cells) are registered in the "connected latch, ff after redistribution" item of the record where the identifier "chp3" of the driving cell is registered in the "identifier" item. Hence, the redistribution processing unit 3c acquires the identifiers "FFA" and "FFB" of the second cells.

The redistribution processing unit 3c then refers to the redistribution information 2b illustrated in FIG. 3, and determines whether or not there is another cell that belongs to the same group 1 as the group 1 to which the cell 18_2 selected by the selection unit 3b belongs. In the case of FIG. 3, there are the other cells 18_1, 18_6, and 18_8. Accordingly, the redistribution processing unit 3c identifies the other cells 18_1, 18_6, and 18_8.

Having acquired the identifier "FF1" of the first cell and the identifiers "FFA" and "FFB" of the second cells, the redistribution processing unit 3c then performs the following process. In other words, the redistribution processing unit 3c determines whether or not the identifiers "FF1", "FF6", and "FF8" of the identified other cells 18_1, 18_6, and 18_8 are included in the identifier "FF1" of the first cell and the identifiers "FFA" and "FFB" of the second cells. In this case, the redistribution processing unit 3c determines that the identifier "FF1" of the cell 18_1 out of the other cells 18_1, 18_6, and 18_8 is included in the identifier "FF1" of the first cell. In other words, the redistribution processing unit 3c determines that the cell 18_1 connected to the cell 16_1 upstream of the cell 18_2 selected by the selection unit 3b before the redistribution of the clock tree belongs to the same group as the selected cell 18_2.

Hence, the redistribution processing unit 3c registers, in the connection candidate file 2f, the identifier "chp1" of the cell 16_1 upstream of the cell 18_1 out of the identified other cells 18_1, 18_6, and 18_8. The redistribution processing unit 3c then transmits, to the check processing unit 3d, an instruction to execute the design rule checking process.

When having accepted the instruction to execute the design rule checking process transmitted from the redistribution processing unit 3c, the check processing unit 3d registers "null" in the determination flag 2g first and initializes the determination flag 2g. The check processing unit 3d then acquires the identifier "chp1" of the driving cell registered in the connection candidate file 2f.

The check processing unit 3d then acquires the drivability "3.883" of the output pin X of the cell 16_1 indicated by the acquired identifier "chp1", from the "output pin drivability" item of the second analysis table 2e. Moreover, assuming that the selected cell 18_2 is connected to the cell 16_1 indicated by the acquired identifier "chp1", the check processing unit 3d performs the following process. In other words, the check processing unit 3d acquires the capacitance of the input pins of the cells 18_1 and 18_2 that are all that are connected to the output pin X of the cell 16_1 indicated by the identifier "chp1" from the "input pin capacitance" item of the first analysis table 2d, and calculates the sum total of the acquired capacitance of the input pins. In other words, the check processing unit 3d calculates the sum total "0.958" ("0.336"+"0.622") of the acquired input pins. The check processing unit 3d then determines that the acquired drivability "3.883" of the output pin of the driving cell is equal to or more than the calculated sum total "0.958" of the capacitance of the input pins.

Having determined that the acquired drivability "3.883" of the output pin of the driving cell is equal to or more than the calculated sum total "0.958" of the capacitance of the input pins, the check processing unit 3d performs the following process. In other words, the check processing unit 3d acquires the maximum fan-out, "8", registered in the design rules 2c illustrated in FIG. 4. The check processing unit 3d then acquires the fan-out, "1", of the cell 16_1 indicated by the acquired identifier "chp1", from the "output pin fanout" item of the second analysis table 2e illustrated in FIG. 10. The check processing unit 3d then determines that the fan-out, "1", of the cell 16_1 indicated by the acquired identifier "chp1" is equal to or less than "7" (the maximum fan-out "8"−"1"). Having determined that the fan-out, "1", of the cell 16_1 indicated by the acquired identifier "chp1" is equal to or less than "7", the check processing unit 3d performs the following process. In other words, the check processing unit 3d determines whether or not the skew of the cells 18_1 and 18_2 that are all that are connected to the cell 16_1 indicated by the identifier "chp1" meets the predetermined standard, assuming that the cell 18_2 is connected to the cell 16_1 indicated by the identifier "chp1". It is assumed here that the check processing unit 3d has determined that the predetermined standard is met. Hence, the check processing unit 3d registers, in the determination flag 2g, "1" indicating to be not against the design rules.

The redistribution processing unit 3c then determines whether or not the value of the determination flag 2g is "1" to determine whether or not the various design rules are satisfied. If the redistribution processing unit 3c determines that the value of the determination flag 2g is "1", the connection processing unit 3e performs the following process. In other words, the connection processing unit 3e generates information that the driving cell 16_1 indicated by the identifier "chp1" registered in the connection candidate file 2f is connected to the cell 18_2 selected by the selection unit 3b, and adds the generated information to the circuit information 2a. Consequently, the semiconductor integrated circuit indicated by the circuit information 2a represents a state where the cells 16_1 and 18_2, which are indicated by the added information, are connected. The connection processing unit 3e then registers the following identifier in the "upstream cell after redistribution" item of the record of the first analysis table 2d, where the identifier "FF2" of the cell 18_2 selected by the selection unit 3b is registered in the "ff, latch" item as illustrated in FIG. 11. In other words, the connection processing unit 3e registers the identifier "chp1" registered in the connection candidate file 2f in the "upstream cell after redistribution" item. The connection processing unit 3e then registers the following identifier in the "connected latch, ff after redistribution" item of the record of the second analysis table 2e, where the identifier "chp1" registered in the connection candidate file 2f is registered in the "identifier" item as illustrated in FIG. 12. In other words, the connection processing unit 3e registers the identifier "FF2" of the selected cell 18_2 in the "connected latch, ff after redistribution" item. Moreover, the connection processing unit 3e registers the identifier "1" of the group 1 to which the selected cell 18_2 belongs (the group indicated by the redistribution information 2b) in the "connected Group after redistribution" item of the record as illustrated in FIG. 12. Moreover, the connection processing unit 3e increments by one the numerical value registered in the "output pin fanout" item of the record as illustrated in FIG. 12. The connection processing unit 3e then deletes the identifier of the driving cell registered in the connection candidate file 2f. FIG. 11 is a diagram illustrating an example of the first analysis table used in the processes. FIG. 12 is a diagram illustrating an example of the second analysis table used in the processes.

Next, as illustrated in the example of FIG. 11, if the selection unit 3b selects the cell 18_6 belonging to the group 1 as the process target cell, the redistribution processing unit 3c performs the following process. In other words, the redistribution processing unit 3c refers to the first analysis table 2d illustrated in FIG. 11, and acquires the identifier "chp2" of the driving cell registered in "upstream cell before redistribution" of the record where the identifier "FF6" of the selected cell 18_6 is registered in the "ff, latch" item. The redistribution processing unit 3c then refers to the second analysis table 2e illustrated in FIG. 12, and determines whether or not the identifier of another driving cell is registered in the "same connections to all input pins" item of the record where the identifier "chp2" of the driving cell is registered in the "identifier" item. In the case of FIG. 12, the redistribution processing unit 3c determines that the identifier of another driving cell is not registered in the "same connections to all input pins" item of the record where the identifier "chp2" of the driving cell is registered in the "identifier" item. The redistribution processing unit 3c then refers to the second analysis table 2e, and determines whether or not the identifier of the cell (the identifier of the first cell) is registered in the "connected latch, ff after redistribution" item of the record where the identifier "chp2" of the driving cell is registered in the "identifier" item. In the case of FIG. 12, the redistribution processing unit 3c determines that the identifier of the cell (the identifier of the first cell) is not registered in the "connected latch, ff after redistribution" item of the record where the identifier "chp2" is registered in the "identifier" item.

Hence, the redistribution processing unit 3c registers the identifier "chp2" of the cell (the identifier of the first driving cell) upstream of the selected cell 18_6 before the redistribution of the clock tree in the connection candidate file 2f. The redistribution processing unit 3c then transmits, to the check processing unit 3d, an instruction to execute the design rule checking process.

When having accepted the instruction to execute the design rule checking process transmitted from the redistribution processing unit 3c, the check processing unit 3d registers "null" in the determination flag 2g first and initializes the determination flag 2g. The check processing unit 3d then acquires the identifier "chp2" of the driving cell registered in the connection candidate file 2f.

The check processing unit 3d then acquires drivability "5.291" of the output pin X of the cell 16_2 indicated by the acquired identifier "chp2", from the "output pin drivability" item of the second analysis table 2e. Moreover, assuming that the selected cell 18_6 is connected to the cell 16_2 indicated by the acquired identifier "chp2", the check processing unit 3d performs the following process. In other words, the check processing unit 3d acquires the capacitance of the input pin of the cell 18_6 that is all that is connected to the output pin X of the cell 16_2 indicated by the acquired identifier "chp2" from the "input pin capacitance" item of the first analysis table 2d, and calculates the sum total of the acquired capacitance of the input pin. In other words, the check processing unit 3d calculates the sum total "0.537" of the acquired input pin. The check processing unit 3d then determines that the acquired drivability "5.291" of the output pin of the driving cell is equal to or more than the calculated sum total "0.537" of the capacitance of the input pin.

Having determined that the acquired drivability "5.291" of the output pin of the driving cell is equal to or more than the calculated sum total "0.537" of the capacitance of the input pin, the check processing unit 3d performs the following process. In other words, the check processing unit 3d acquires the maximum fan-out, "8", registered in the design rules 2c illustrated in FIG. 4. The check processing unit 3d then acquires the fan-out, "0", of the cell 16_2 indicated by the acquired identifier "chp2", from the "output pin fanout" item of the second analysis table 2e illustrated in FIG. 12. The check processing unit 3d then determines that the fan-out, "0", of the cell 16_2 indicated by the acquired identifier "chp2" is equal to or less than "7" (the maximum fan-out "8"–"1"). Having determined that the fan-out, "0", of the cell 16_2 indicated by the acquired identifier "chp2" is equal to or less than "7", the check processing unit 3d performs the following process. In other words, the check processing unit 3d determines whether or not the skew of the cell 18_6 that is all that is connected to the cell 16_2 indicated by the identifier "chp2" meets the predetermined standard, assuming that the selected cell 18_6 is connected to the cell 16_2 indicated by the identifier "chp2". It is assumed here that the check processing unit 3d has determined that the predetermined standard is met. Hence, the check processing unit 3d registers, in the determination flag 2g, "1" indicating to be not against the design rules.

The redistribution processing unit 3c then determines whether or not the value of the determination flag 2g is "1" to determine whether or not the various design rules are satisfied. If the redistribution processing unit 3c determines that the value of the determination flag 2g is "1", the connection processing unit 3e performs the following process. In other words, the connection processing unit 3e generates information that the driving cell 16_2 indicated by the identifier "chp2" registered in the connection candidate file 2f is connected to the cell 18_6 selected by the selection unit 3b, and adds the generated information to the circuit information 2a. Consequently, the semiconductor integrated circuit indicated by the circuit information 2a represents a state where the cells 16_2 and 18_6, which are indicated by the added information, are connected. The connection processing unit 3e then registers the following identifier in the "upstream cell after redistribution" item of the record of the first analysis table 2d, where the identifier "FF6" of the cell 18_6 selected by the selection unit 3b is registered in the "ff, latch" item as illustrated in FIG. 13. In other words, the connection processing unit 3e registers, in the "upstream cell after redistribution" item, the identifier "chp2" registered in the connection candidate file 2f. The connection processing unit 3e then registers the following identifier in the "connected latch, ff after redistribution" item of the record of the second analysis table 2e, where the identifier "chp2" registered in the connection candidate file 2f is registered in the "identifier" item as illustrated in FIG. 14. In other words, the connection processing unit 3e registers the identifier "FF6" of the selected cell 18_6 in the "connected latch, ff after redistribution" item. Moreover, the connection processing unit 3e registers the identifier "1" of the group 1 to which the selected cell 18_6 belongs (the group indicated by the redistribution information 2b) in the "connected Group after redistribution" item of the record as illustrated in FIG. 14. Moreover, the connection processing unit 3e increments by one the numerical value registered in the "output pin fanout" item of the record as illustrated in FIG.

14. The connection processing unit 3e then deletes the identifier of the driving cell registered in the connection candidate file 2f. FIG. 13 is a diagram illustrating an example of the first analysis table used in the processes. FIG. 14 is a diagram illustrating an example of the second analysis table used in the processes.

Next, as illustrated in the example of FIG. 13, if the selection unit 3b selects the cell 18_8 belonging to the group 1 as the process target cell, the redistribution processing unit 3c refers to the first analysis table 2d illustrated in FIG. 13, and performs the following process.

In other words, the redistribution processing unit 3c acquires the identifier "chp2" of the driving cell registered in "upstream cell before redistribution" of the record where the identifier "FF8" of the selected cell 18_8 is registered in the "ff, latch" item. The redistribution processing unit 3c then refers to the second analysis table 2e illustrated in FIG. 14, and determines whether or not the identifier of another driving cell is registered in the "same connections to all input pins" item of the record where the identifier "chp2" of the driving cell is registered in the "identifier" item. In the case of FIG. 14, the redistribution processing unit 3c determines that the identifier of another driving cell is not registered in the "same connections to all input pins" item of the record where the identifier "chp2" of the driving cell is registered in the "identifier" item. The redistribution processing unit 3c then refers to the second analysis table 2e, and determines whether or not the identifier of the cell (the identifier of the first cell) is registered in the "connected latch, ff after redistribution" item of the record where the identifier "chp2" of the driving cell is registered in the "identifier" item. In the case of FIG. 14, the redistribution processing unit 3c determines that the identifier "FF6" of the cell (the identifier of the first cell) is registered in the "connected latch, ff after redistribution" item of the record where the identifier "chp2" is registered in the "identifier" item.

The redistribution processing unit 3c then refers to the redistribution information 2b illustrated in FIG. 3, and determines whether or not there is another cell that belongs to the same group 1 as the group 1 to which the cell 18_8 selected by the selection unit 3b belongs. In the case of FIG. 3, there are the other cells 18_1, 18_2, and 18_6. Accordingly, the redistribution processing unit 3c identifies the other cells 18_1, 18_2, and 18_6.

Having acquired the identifier "FF6" of the first cell, the redistribution processing unit 3c performs the following process. In other words, the redistribution processing unit 3c determines whether or not the identifiers "FF1", "FF2", and "FF6" of the identified other cells 18_1, 18_2, and 18_6 are included in the identifier "FF6" of the first cell. In this case, the redistribution processing unit 3c determines that the identifier "FF6" of the cell 18_6 out of the other cells 18_1, 18_2, and 18_6 is included in the identifier "FF6" of the first cell. In other words, the redistribution processing unit 3c determines that the cell 18_6 connected to the cell 16_2 upstream of the cell 18_8 selected by the selection unit 3b before the redistribution of the clock tree belongs to the same group as the selected cell 18_8.

Hence, the redistribution processing unit 3c registers, in the connection candidate file 2f, the identifier "chp2" of the cell 16_2 upstream of the cell 18_6 out of the identified other cells 18_1, 18_2, and 18_6. The redistribution processing unit 3c then transmits, to the check processing unit 3d, an instruction to execute the design rule checking process.

When having accepted the instruction to execute the design rule checking process transmitted from the redistribution processing unit 3c, the check processing unit 3d registers "null" in the determination flag 2g first and initializes the determination flag 2g. The check processing unit 3d then acquires the identifier "chp2" of the driving cell registered in the connection candidate file 2f.

The check processing unit 3d then acquires the drivability "5.291" of the output pin X of the cell 16_2 indicated by the acquired identifier "chp2", from the "output pin drivability" item of the second analysis table 2e. Moreover, assuming that the selected cell 18_8 is connected to the cell 16_2 indicated by the acquired identifier "chp2", the check processing unit 3d performs the following process. In other words, the check processing unit 3d acquires the capacitance of the input pins of the cells 18_6 and 18_8 that are all that are connected to the output pin X of the cell 16_2 indicated by the identifier "chp2" from the "input pin capacitance" item of the first analysis table 2d, and calculates the sum total of the capacitance of the acquired input pins. In other words, the check processing unit 3d calculates the sum total "0.983" ("0.537"+ "0.446") of the acquired input pins. The check processing unit 3d then determines that the acquired drivability "5.291" of the output pin of the driving cell is equal to or more than the calculated sum total "0.983" of the capacitance of the input pins.

Having determined that the acquired drivability "5.291" of the output pin of the driving cell is equal to or more than the calculated sum total "0.983" of the capacitance of the input pins, the check processing unit 3d performs the following process. In other words, the check processing unit 3d acquires the maximum fan-out, "8", registered in the design rules 2c illustrated in FIG. 4. The check processing unit 3d then acquires the fan-out, "1", of the cell 16_2 indicated by the acquired identifier "chp2" from the "output pin fanout" item of the second analysis table 2e illustrated in FIG. 14. The check processing unit 3d then determines that the fan-out, "1", of the cell 16_2 indicated by the acquired identifier "chp2" is equal to or less than "7" (the maximum fan-out "8"–"1"). Having determined that the fan-out, "1", of the cell 16_2 indicated by the acquired identifier "chp2" is equal to or less than "7", the check processing unit 3d performs the following process. In other words, the check processing unit 3d determines whether or not the skew of the cells 18_6 and 18_8 that are all that are connected to the cell 16_2 indicated by the identifier "chp2" meets the predetermined standard, assuming that the cell 18_8 is connected to the cell 16_2 indicated by the identifier "chp2". It is assumed here that the check processing unit 3d has determined that the predetermined standard is met. Hence, the check processing unit 3d registers, in the determination flag 2g, "1" indicating to be not against the design rules.

The redistribution processing unit 3c then determines whether or not the value of the determination flag 2g is "1" to determine whether or not the various design rules are satisfied. If the redistribution processing unit 3c determines that the value of the determination flag 2g is "1", the connection processing unit 3e performs the following process. In other words, the connection processing unit 3e generates information that the driving cell 16_2 indicated by the identifier "chp2" registered in the connection candidate file 2f is connected to the cell 18_8 selected by the selection unit 3b, and adds the generated information to the circuit information 2a. Consequently, the semiconductor integrated circuit indicated by the circuit information 2a represents a state where the cells 16_2 and 18_8, which are indicated by the added information, are connected. The connection processing unit 3e then registers the following identifier in the "upstream cell after redistribution" item of the record of the first analysis table 2d, where the identifier "FF8" of the selected cell 18_8 is registered in the "ff, latch" item as illustrated in FIG. 15. In other words, the connection processing unit 3*e* registers the identifier "chp2" registered in the connection candidate file 2*f* in the "upstream cell after redistribution" item. The connection processing unit 3*e* then registers the following identifier in the "connected latch, ff after redistribution" item of the record of the second analysis table 2*e*, where the identifier "chp2" registered in the connection candidate file 2*f* is registered in the "identifier" item as illustrated in FIG. 16. In other words, the connection processing unit 3*e* registers the identifier "FF8" of the selected cell 18_8 in the "connected latch, ff after redistribution" item. Moreover, the connection processing unit 3*e* registers the identifier "1" of the group 1 to which the selected cell 18_8 belongs (the group indicated by the redistribution information 2*b*) in the "connected Group after redistribution" item of the record as illustrated in FIG. 16. Moreover, the connection processing unit 3*e* increments by one the numerical value registered in the "output pin fanout" item of the record as illustrated in FIG. 16. The connection processing unit 3*e* then deletes the identifier of the driving cell registered in the connection candidate file 2*f*. FIG. 15 is a diagram illustrating an example of the first analysis table used in the processes. FIG. 16 is a diagram illustrating an example of the second analysis table used in the processes.

Next, as illustrated in the example of FIG. 15, if the selection unit 3*b* selects the cell 18_3 belonging to the group 2 as the process target cell, the redistribution processing unit 3*c* performs the following process. In other words, the redistribution processing unit 3*c* refers to the first analysis table 2*d* illustrated in FIG. 15, and acquires the identifier "chp1" of the driving cell registered in "upstream cell before redistribution" of the record where the identifier "FF3" of the selected cell 18_3 is registered in the "ff, latch" item. The redistribution processing unit 3*c* then refers to the second analysis table 2*e* illustrated in FIG. 16, and acquires the identifier "chp3" of another driving cell registered in the "same connections to all input pins" item of the record where the identifier "chp1" of the driving cell is registered in the "identifier" item. The redistribution processing unit 3*c* then refers to the second analysis table 2*e*, and determines whether or not the identifier of the cell (the identifier of the first cell) is registered in the "connected latch, ff after redistribution" item of the record where the identifier "chp1" of the driving cell is registered in the "identifier" item. In the case of FIG. 16, the redistribution processing unit 3*c* determines that the identifiers "FF1" and "FF2" of the cells (the identifiers of the first cells) are registered in the "connected latch, ff after redistribution" item of the record where the identifier "chp1" is registered in the "identifier" item. Hence, the redistribution processing unit 3*c* acquires the identifiers "FF1" and "FF2" of the first cells.

Moreover, having acquired the identifier "chp3" of the driving cell, the redistribution processing unit 3*c* refers to the second analysis table 2*e* and performs the following process. In other words, the redistribution processing unit 3*c* determines whether or not the identifier of the cell (the identifier of the second cell) is registered in the "connected latch, ff after redistribution" item of the record where the identifier "chp3" of the driving cell is registered in the "identifier" item. In the case of FIG. 16, the redistribution processing unit 3*c* determines that the identifiers "FFA" and "FFB" of the cells (the identifiers of the second cells) are registered in the "connected latch, ff after redistribution" item of the record where the identifier "chp3" of the driving cell is registered in the "identifier" item. Hence, the redistribution processing unit 3*c* acquires the identifiers "FFA" and "FFB" of the second cells.

The redistribution processing unit 3*c* then refers to the redistribution information 2*b* illustrated in FIG. 3, and determines whether or not there is another cell that belongs to the same group as the group 2 to which the cell 18_3 selected by the selection unit 3*b* belongs. In the case of FIG. 3, there are the other cells 18_4, 18_9, 18_10, and 18_12. Accordingly, the redistribution processing unit 3*c* identifies the other cells 18_4, 18_9, 18_10, and 18_12.

Having acquired the identifiers "FF1" and "FF2" of the first cells and the identifiers "FFA" and "FFB" of the second cells, the redistribution processing unit 3*c* then performs the following process. In other words, the redistribution processing unit 3*c* determines whether or not the identifiers "FF4", "FF9", "FF10", and "FF12" of the other cells 18_4, 18_9, 18_10, and 18_12 are included in the identifiers "FF1", "FF2", "FFA", and "FFB". In this case, the redistribution processing unit 3*c* determines that the identifiers "FF4", "FF9", "FF10", and "FF12" are not included in the identifiers "FF1" and "FF2" of the first cells and the identifiers "FFA" and "FFB" of the second cells. In other words, the redistribution processing unit 3*c* determines that the cells connected to the driving cell upstream of the cell selected by the selection unit 3*b* before the redistribution of the clock tree and the driving cell having the same input signals do not belong to the same group as the selected cell.

The redistribution processing unit 3*c* then determines whether or not the identifier of the cell (the identifier of the first cell) is registered in the "connected latch, ff after redistribution" item of the record where the identifier "chp1" of the first driving cell is registered in the "identifier" item. In the case of FIG. 16, the redistribution processing unit 3*c* determines that the identifier of the cell (the identifier of the first cell) is not registered in the "connected latch, ff after redistribution" item of the record where the identifier "chp1" of the first driving cell is registered in the "identifier" item. Therefore, the redistribution processing unit 3*c* creates a cell 16_1_2 that is a copy of the cell (the first driving cell) 16_1 upstream of the selected cell 18_3 before the redistribution of the clock tree. The redistribution processing unit 3*c* then registers an identifier "chp1_2" of the copied cell 16_1_2 in the connection candidate file 2*f*.

The redistribution processing unit 3*c* then transmits, to the check processing unit 3*d*, an instruction to execute the design rule checking process.

When having accepted the instruction to execute the design rule checking process transmitted from the redistribution processing unit 3*c*, the check processing unit 3*d* registers "null" in the determination flag 2*g* first and initializes the determination flag 2*g*. The check processing unit 3*d* then acquires the identifier "chp1_2" of the driving cell registered in the connection candidate file 2*f*.

The check processing unit 3*d* then acquires the drivability of an output pin X of the cell 16_1_2 indicated by the acquired identifier "chp1_2" as follows. In other words, the cell 16_1_2 is the copy of the cell 16_1. Hence, the drivability of the cell 16_1_2 is the same as the drivability of the cell 16_1. Hence, the check processing unit 3*d* acquires the drivability "3.883" of the output pin X of the cell 16_1 from the "output pin drivability" item of the second analysis table 2*e* to acquire the drivability "3.883" of the output pin X of the cell 16_1_2. Moreover, assuming that the selected cell 18_3 is connected to the cell 16_1_2 indicated by the acquired identifier "chp1_2", the check processing unit 3*d* performs the following process. In other words, the check processing unit 3*d* acquires the capacitance of the input pin of the cell 18_3 that is all that is connected to the output pin X of the cell 16_1_2 indicated by the identifier "chp1_2" from the "input pin capacitance" item of the first analysis table 2*d*, and calculates the sum total of the acquired capacitance of the input pin. In other words, the check processing unit 3*d* calculates the sum total "0.413" of the acquired input pin. The check processing unit 3*d* then determines that the acquired drivability "3.883" of the output pin of the driving cell is equal to or more than the calculated sum total "0.413" of the capacitance of the input pin.

Having determined that the acquired drivability "3.883" of the output pin of the driving cell is equal to or more than the calculated sum total "0.413" of the capacitance of the input pin, the check processing unit 3*d* performs the following process. In other words, the check processing unit 3*d* acquires the maximum fan-out, "8", registered in the design rules 2*c* illustrated in FIG. 4. The check processing unit 3*d* then calculates the fan-out, "1", of the cell 16_1_2 indicated by the acquired identifier "chp1__2" from the number of cells connected to the output pin X of the cell 16_1_2. The check processing unit 3*d* then determines that the fan-out, "1", of the cell 16_1_2 indicated by the acquired identifier "chp1__2" is equal to or less than "7" (the maximum fan-out "8"–"1"). Having determined that the fan-out, "1", of the cell 16_1_2 indicated by the acquired identifier "chp1__2" is equal to or less than "7", the check processing unit 3*d* performs the following process. The check processing unit 3*d* determines whether or not the skew of the cell 18_3 that is all that is connected to the cell 16_1_2 indicated by the identifier "chp1__2" meets the predetermined standard, assuming the cell 18_3 is connected to the cell 16_1_2 indicated by the identifier "chp1__2". It is assumed here that the check processing unit 3*d* has determined that the predetermined standard is met. Hence, the check processing unit 3*d* registers, in the determination flag 2*g*, "1" indicating to be not against the design rules.

The redistribution processing unit 3*c* then determines whether or not the value of the determination flag 2*g* is "1" to determine whether or not the various design rules are satisfied. If the redistribution processing unit 3*c* determines that the value of the determination flag 2*g* is "1", the connection processing unit 3*e* performs the following process. In other words, the connection processing unit 3*e* generates information that the driving cell 16_1_2 indicated by the identifier "chp1__2" registered in the connection candidate file 2*f* is connected to the cell 18_3 selected by the selection unit 3*b*, and adds the generated information to the circuit information 2*a*. Consequently, the semiconductor integrated circuit indicated by the circuit information 2*a* represents a state where the cells 16_1_2 and 18_3, which are indicated by the added information, are connected. The connection processing unit 3*e* then registers the following identifier in the "upstream cell after redistribution" item of the record of the first analysis table 2*d*, where the identifier "FF3" of the cell 18_3 selected by the selection unit 3*b* is registered in the "ff, latch" item as illustrated in FIG. 17. In other words, the connection processing unit 3*e* registers, in the "upstream cell after redistribution" item, the identifier "chp1__2" registered in the connection candidate file 2*f*. The connection processing unit 3*e* then adds a new record to the second analysis table 2*e* as illustrated in FIG. 18, and registers, in the "identifier" item of the added record, the identifier "chp1__2" registered in the connection candidate file 2*f*. Moreover, as illustrated in FIG. 18, the connection processing unit 3*e* copies, in the "input pin" item of the added record, the registered content of the "input pin" item of the record where the identifier "chp1" indicating the cell 16_1 being the copy source of the cell 16_1_2 is registered in the "identifier" item. Moreover, as illustrated in FIG. 18, the connection processing unit 3*e* copies, in the "drive pin" item of the added record, the registered content of the "drive pin" item of the record where the identifier "chp1" is registered in the "identifier" item. Moreover, as illustrated in FIG. 18, the connection processing unit 3*e* copies, in the "output pin drivability" item of the added record, the registered content of the "output pin drivability" item of the record where the identifier "chp1" is registered in the "identifier" item. Moreover, as illustrated in FIG. 18, the connection processing unit 3*e* registers the identifiers "chp1" and "chp3" in the "same connections to all input pins" item of the added record. Moreover, as illustrated in FIG. 18, the connection processing unit 3*e* registers the identifier "FF3" of the cell 18_3 connected to the cell 16_1_2 indicated by the identifier "chp1__2", in the "connected latch, ff after redistribution" item of the added record. Moreover, as illustrated in FIG. 18, the connection processing unit 3*e* registers the identifier "2" of the group 2 to which the selected cell 18_3 belongs (the group indicated by the redistribution information 2*b*) in the "connected Group after redistribution" item of the added record. Moreover, as illustrated in FIG. 18, the connection processing unit 3*e* increments by one the numerical value registered in the "output pin fanout" item of the added record.

Moreover, as illustrated in FIG. 18, the connection processing unit 3*e* registers "chp1__2" in the "same connections to all input pins" item of the record where the identifier "chp1" is registered in the "identifier" item. Moreover, as illustrated in FIG. 18, the connection processing unit 3*e* registers "chp1__2" in the "same connections to all input pins" item of the record where the identifier "chp3" is registered in the "identifier" item.

The connection processing unit 3*e* then deletes the identifier of the driving cell registered in the connection candidate file 2*f*. FIG. 17 is a diagram illustrating an example of the first analysis table used in the processes. FIG. 18 is a diagram illustrating an example of the second analysis table used in the processes.

FIG. 19 is a diagram illustrating an example of the first analysis table as a result of having similarly performed the processes also on the cells 18_4, 18_9, 18_10, and 18_12 that belong to the group 2 indicated by the redistribution information of FIG. 3. FIG. 20 is a diagram illustrating an example of the second analysis table as a result of having similarly performed the processes also on the cells 18_4, 18_9, 18_10, and 18_12 that belong to the group 2 indicated by the redistribution information of FIG. 3.

As illustrated in FIGS. 19 and 20, the cell 18_4 indicated by the identifier "FF4" is connected to the cell 16_1_2 indicated by the identifier "chp1__2". Moreover, as illustrated in FIGS. 19 and 20, the cell 18_10 indicated by the identifier "FF10" is also connected to the cell 16_1_2 indicated by the identifier "chp1__2". Moreover, as illustrated in FIGS. 19 and 20, the cell 18_12 indicated by the identifier "FF12" is also connected to the cell 16_1_2 indicated by the identifier "chp1__2". Moreover, as illustrated in FIGS. 19 and 20, the cell 18_9 indicated by the identifier "FF9" is connected to a cell 16_2_2 indicated by an identifier "chp2__2", the cell 16_2_2 being a copy of the cell 16_2 indicated by the identifier "chp2".

FIG. 21 is a diagram illustrating an example of the first analysis table as a result of having similarly performed the processes also on the cells 18_5 and 18_14 that belong to the group 3, the cell 18_13 that belongs to the group 4, and the cells 18_7 and 18_11 that belong to the group 5, the groups being indicated by the redistribution information of FIG. 3. FIG. 22 is a diagram illustrating an example of the second analysis table as a result of having similarly performed the processes also on the cells 18_5 and 18_14 that belong to the group 3, the cell 18_13 that belongs to the group 4, and the cells 18_7 and 18_11 that belong to the group 5, the groups being indicated by the redistribution information of FIG. 3.

As illustrated in FIGS. 21 and 22, the cell 18_5 indicated by the identifier "FF5" is connected to a cell 16_1_3 indicated by an identifier "chp1__3", the cell 16_1_3 being a copy of the cell 16_1 indicated by the identifier "chp1". Moreover, as illustrated in FIGS. 21 and 22, the cell 18_14 indicated by the identifier "FF14" is also connected to the cell 16_1_3 indicated by the identifier "chp1__3". Moreover, as illustrated in FIGS. 21 and 22, the cell 18_13 indicated by the identifier "FF13" is connected to a cell 16_3_2 indicated by an identifier "chp3__2", the cell 16_3_2 being a copy of the cell 16_3 indicated by the identifier "chp3". Moreover, as illustrated in FIGS. 21 and 22, the cell 18_7 indicated by the identifier "FF7" is connected to a cell 16_2_3 indicated by an identifier "chp2__3", the cell 16_2_3 being a copy of the cell 16_2 indicated by the identifier "chp2". Moreover, as illustrated in FIGS. 21 and 22, the cell 18_11 indicated by the identifier "FF11" is connected to a cell 16_3_3 indicated by an identifier "chp3__3", the cell 16_3_3 being a copy of the cell 16_3 indicated by the identifier "chp3".

Figure 23:
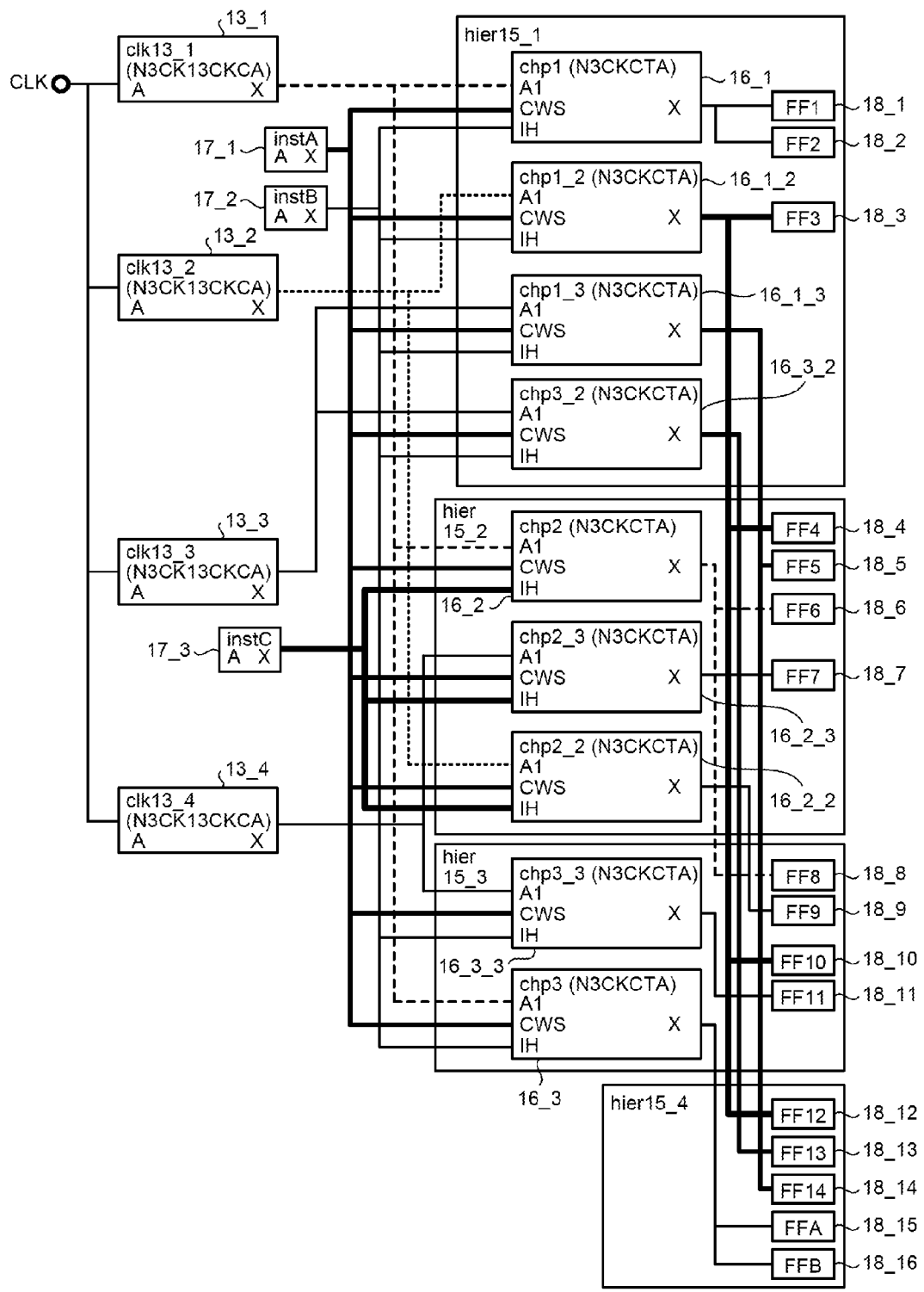
FIG. 23 is a diagram illustrating an example of the semiconductor integrated circuit indicated by the circuit information after the redistribution of the clock tree.

The output control unit 3f then controls the output unit 12 to display the semiconductor integrated circuit after the redistribution of the clock tree. FIG. 23 is a diagram illustrating an example of the semiconductor integrated circuit indicated by the circuit information after the redistribution of the clock tree. For example, if various contents are registered in the first analysis table 2d and the second analysis table 2e as a result of having performed various processes on all the cells 18_1 to 18_16 as illustrated in FIGS. 21 and 22, the output control unit 3f performs the following process. In other words, the output control unit 3f controls the output unit 12 to display the semiconductor integrated circuit indicated by the circuit information 2a as illustrated in FIG. 23. As a result of having performed various processes on all the cells 18_1 to 18_16, information indicating the semiconductor integrated circuit after the redistribution of the clock tree is registered in the circuit information.

Flow of Process

Figure 24:
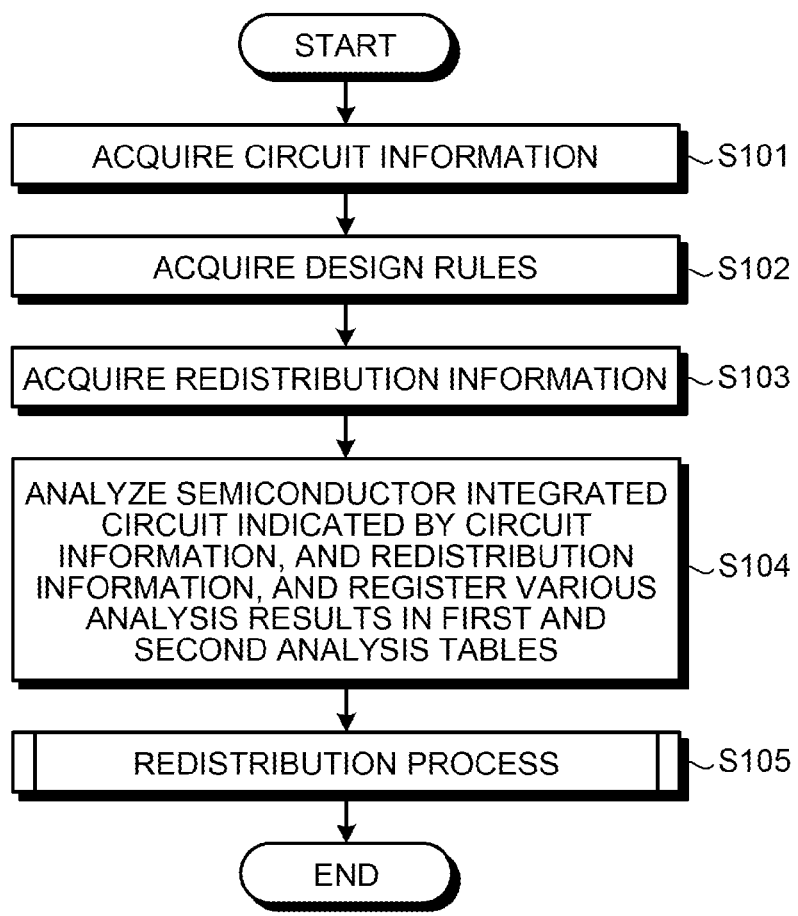
FIG. 24 is a flowchart illustrating a procedure for a design support process according to the embodiment.

Next, a description is given of the flow of the process to be executed by the design support apparatus 1 according to the embodiment. FIG. 24 is a flowchart illustrating a procedure for the design support process according to the embodiment. The design support process according to the embodiment is executed by the control unit 3, for example, when the input unit 11 inputs an instruction to execute the design support process into the control unit 3.

As illustrated in FIG. 24, the analysis unit 3a acquires the circuit information 2a from the storage unit 2 (S101). The analysis unit 3a then acquires the design rules 2c from the storage unit 2 (S102). The analysis unit 3a then acquires the redistribution information 2b from the storage unit 2 (S103).

The analysis unit 3a then analyzes the semiconductor integrated circuit indicated by the acquired circuit information 2a, and the acquired redistribution information 2b, and registers various analysis results in the first analysis table 2d and the second analysis table 2e as described above (S104). The selection unit 3b, the redistribution processing unit 3c, the check processing unit 3d, the connection processing unit 3e, and the output control unit 3f execute the processes of the redistribution process, respectively (S105), and the design support process ends.

Figure 25:
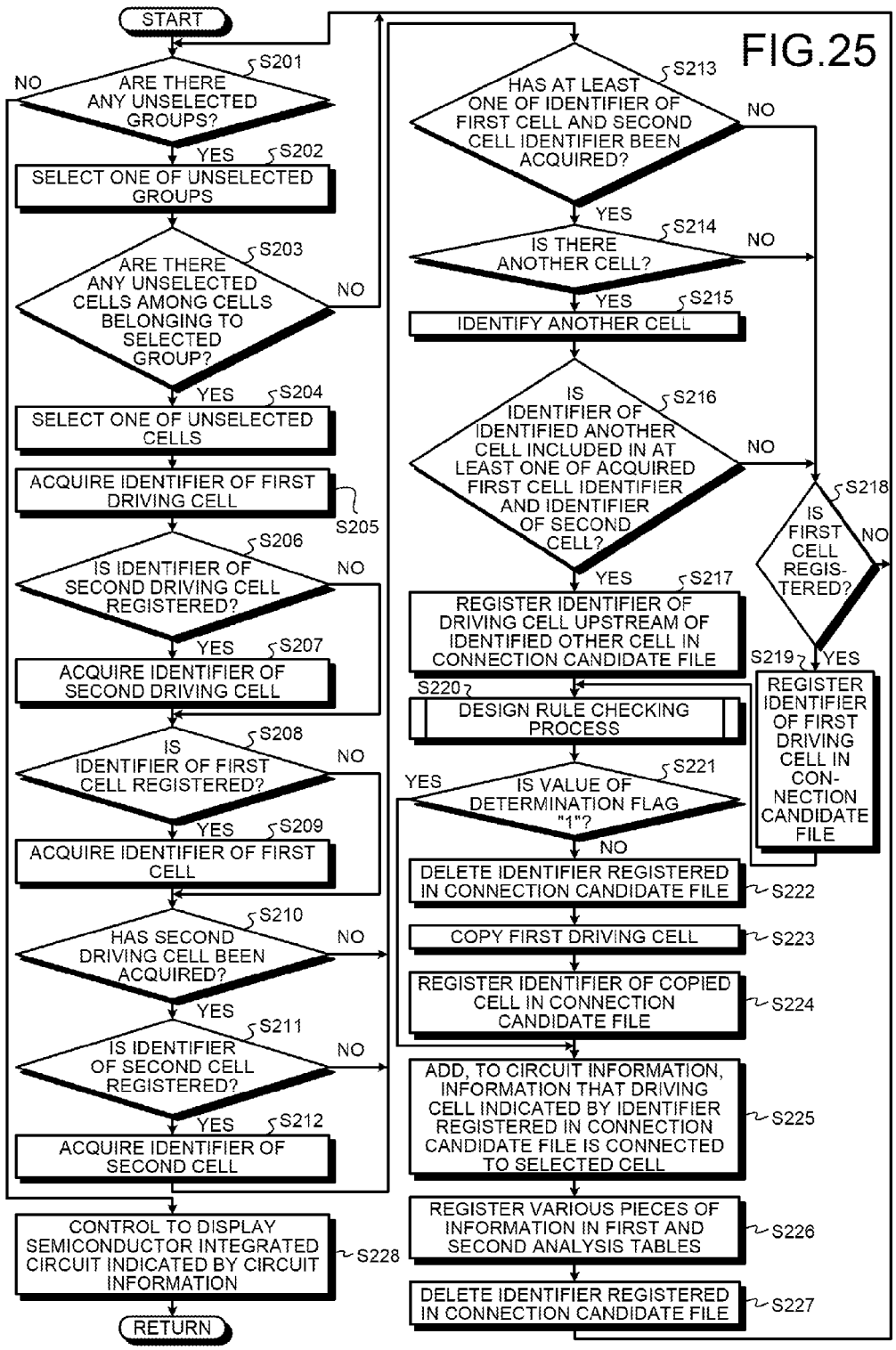
FIG. 25 is a flowchart illustrating a procedure for a redistribution process according to the embodiment.

FIG. 25 is a flowchart illustrating a procedure for the redistribution process according to the embodiment. As illustrated in FIG. 25, the selection unit 3b determines whether or not there are any unselected groups among the groups indicated by the redistribution information 2b (S201). If there are unselected groups (S201; Yes), the selection unit 3b selects one of the unselected groups (S202).

The selection unit 3b determines whether or not there are any unselected cells among the cells belonging to the selected group (S203). If there is no unselected cell (S203; No), the selection unit 3b returns to S201. On the other hand, if there are unselected cells (S203; Yes), the selection unit 3b selects one of the unselected cells as a process target cell (S204).

The redistribution processing unit 3c refers to the first analysis table 2d, and acquires the identifier of the driving cell (the identifier of the first driving cell) registered in "upstream cell before redistribution" of the record where the identifier of the selected cell is registered in the "ff, latch" item (S205). The redistribution processing unit 3c refers to the second analysis table 2e, and determines whether or not the identifier of another driving cell (the identifier of the second driving cell) is registered in the "same connections to all input pins" item of the record where the identifier of the first driving cell is registered in the "identifier" item (S206). If the identifier of another driving cell (the identifier of the second driving cell) is not registered in the "same connections to all input pins" item (S206; No), the redistribution processing unit 3c proceeds to S208.

If the identifier of another driving cell (the identifier of the second driving cell) is registered in the "same connections to all input pins" item (S206; Yes), the redistribution processing unit 3c acquires the identifier of the another driving cell (the identifier of the second driving cell) (S207).

The redistribution processing unit 3c determines whether or not the identifier of the cell (the identifier of the first cell) is registered in the "connected latch, ff after redistribution" item of the record where the identifier of the first driving cell is registered in the "identifier" item (S208). If the identifier of the cell (the identifier of the first cell) is not registered in the "connected latch, ff after redistribution" item (S208; No), the redistribution processing unit 3c proceeds to S210.

If the identifier of the cell (the identifier of the first cell) is registered in the "connected latch, ff after redistribution" item (S208; Yes), the redistribution processing unit 3c performs the following process. In other words, the redistribution processing unit 3c acquires the identifier of the cell (the identifier of the first cell) registered in the "connected latch, ff after redistribution" item (S209).

The redistribution processing unit 3c determines whether or not to have acquired the identifier of the second driving cell (S210). If having not acquired the identifier of the second driving cell (S210; No), the redistribution processing unit 3c proceeds to S213.

If having acquired the identifier of the second driving cell (S210; Yes), the redistribution processing unit 3c refers to the second analysis table 2e, and performs the following process. In other words, the redistribution processing unit 3c determines whether or not the identifier of the cell (the identifier of the second cell) is registered in the "connected latch, ff after redistribution" item of the record where the identifier of the second driving cell is registered in the "identifier" item (S211). If the identifier of the second cell is not registered in the "connected latch, ff after redistribution" item (S211; No), the redistribution processing unit 3c proceeds to S213.

If the identifier of the second cell is registered in the "connected latch, ff after redistribution" item (S211; Yes), the redistribution processing unit 3c acquires the identifier of the second cell registered in the "connected latch, ff after redistribution" item (S212).

The redistribution processing unit 3c then determines whether or not to have acquired at least one of the identifiers of the first and second cells (S213). If having acquired neither the identifier of the first cell nor the identifier of the second cell (S213; No), the redistribution processing unit 3c proceeds to S218.

If having acquired at least one of the identifiers of the first and second cells (S213; Yes), the redistribution processing unit 3c refers to the redistribution information 2b and performs the following process. In other words, the redistribution processing unit 3c determines whether or not there is another cell that belongs to the same group as the group to which the cell selected by the selection unit 3b belongs (S214). If there is no other cell (S214; No), the redistribution processing unit 3c proceeds to S218.

If there is another cell (S214; Yes), the redistribution processing unit 3c identifies the another cell (S215).

The redistribution processing unit 3c determines whether or not the identifier of the identified another cell is included in at least one of the acquired identifiers of the first and second cells (S216).

If the identifier of the identified another cell is included in the identifier of the first or second cell (S216; Yes), the redistribution processing unit 3c performs the following process. In other words, the redistribution processing unit 3c registers the identifier of the driving cell upstream of the identified another cell in the connection candidate file 2f (S217).

If the identifier of the identified another cell is not included in the acquired identifier (S216; No), the redistribution processing unit 3c refers to the second analysis table 2e, and performs the following process. In other words, the redistribution processing unit 3c determines whether or not the identifier of the cell (the identifier of the first cell) is registered in the "connected latch, ff after redistribution" item of the record where the identifier of the first driving cell is registered in the "identifier" item (S218). If the identifier of the cell (the identifier of the first cell) is registered in the "connected latch, ff after redistribution" item of the record where the identifier of the first driving cell is registered in the "identifier" item (S218; Yes), the redistribution processing unit 3c proceeds to S223.

If the identifier of the cell (the identifier of the first cell) is not registered in the "connected latch, ff after redistribution" item of the record where the identifier of the first driving cell is registered in the "identifier" item (S218; No), the redistribution processing unit 3c performs the following process. In other words, the redistribution processing unit 3c registers, in the connection candidate file 2f, the identifier of the cell (the identifier of the first driving cell) upstream of the selected cell before the redistribution of the clock tree (S219).

The check processing unit 3d executes the design rule checking process (S220). The redistribution processing unit 3c determines whether or not the value of the determination flag 2g is "1" to determine whether or not the various design rules are satisfied (S221). If the value of the determination flag 2g is "1" (S221; Yes), the redistribution processing unit 3c proceeds to S225.

If the value of the determination flag 2g is not "1", that is, "0" (S221; No), the redistribution processing unit 3c deletes the identifier of the driving cell registered in the connection candidate file 2f (S222). The redistribution processing unit 3c copies the cell (the first driving cell) upstream of the selected cell before the redistribution of the clock tree (S223). The redistribution processing unit 3c registers the identifier of the copied cell in the connection candidate file 2f (S224).

The connection processing unit 3e generates information that the driving cell indicated by the identifier registered in the connection candidate file 2f is connected to the cell selected by the selection unit 3b, and adds the generated information to the circuit information 2a (S225). As described above, the connection processing unit 3e registers various pieces of information in the first analysis table 2d and the second analysis table 2e (S226). The connection processing unit 3e deletes the identifier of the driving cell registered in the connection candidate file 2f (S227), and returns to S201.

If it is determined here that there is no unselected group (S201; No), the output control unit 3f controls the output unit 12 to display the semiconductor integrated circuit indicated by the circuit information 2a, the semiconductor integrated circuit having the redistributed clock tree (S228). The output control unit 3f then stores the process result in the internal memory of the control unit 3 and returns.

Figure 26:
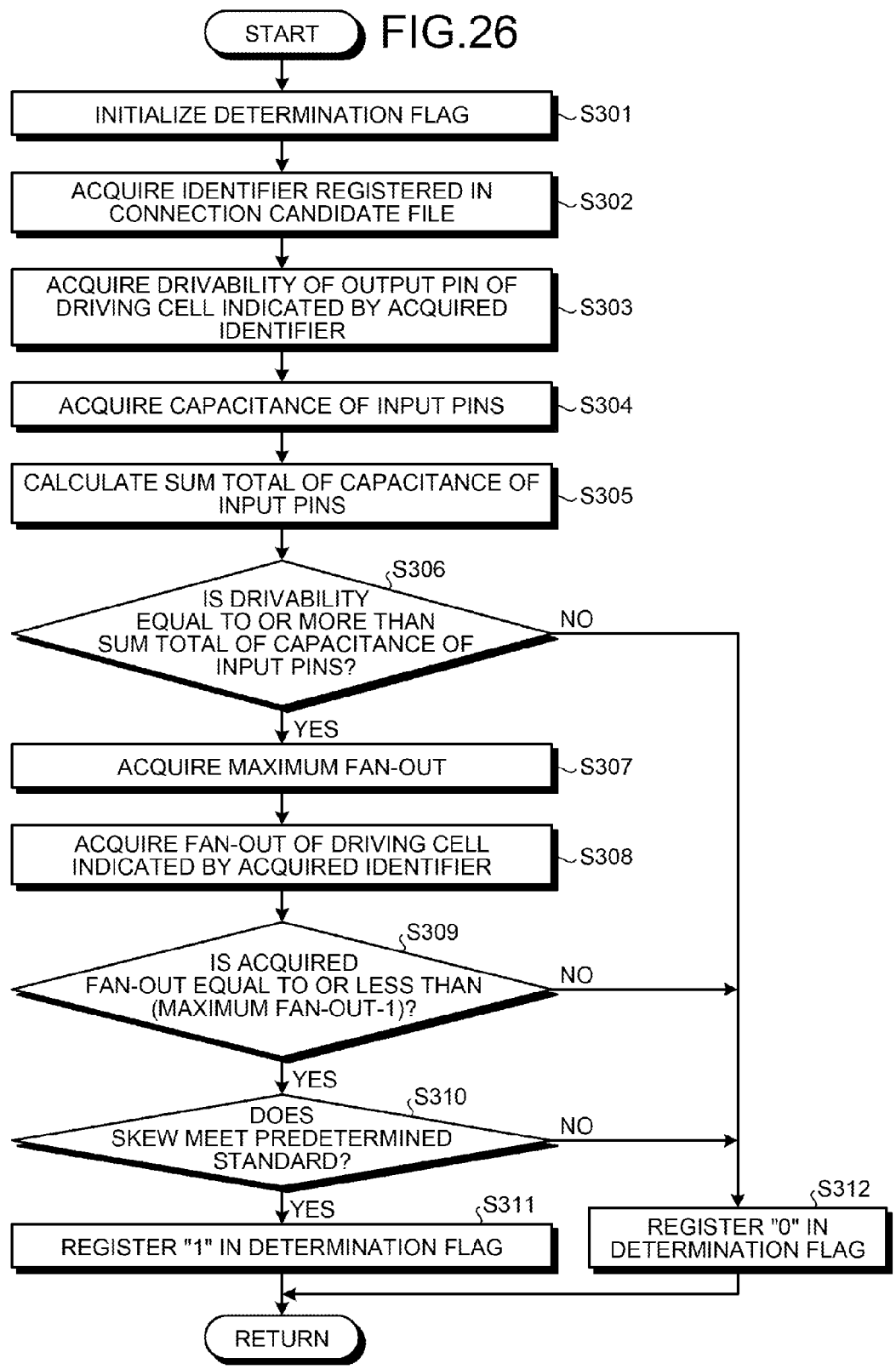
FIG. 26 is a flowchart illustrating a procedure for a design rule checking process according to the embodiment.

FIG. 26 is a flowchart illustrating a procedure for the design rule checking process according to the embodiment. As illustrated in FIG. 26, the check processing unit 3d registers "null" in the determination flag 2g and initializes the determination flag 2g (S301). The check processing unit 3d acquires the identifier of the driving cell registered in the connection candidate file 2f (S302).

The check processing unit 3d acquires the drivability of the output pin of the driving cell indicated by the acquired identifier from the "output pin drivability" item of the second analysis table 2e (S303). Assuming that the selected cell is connected to the driving cell indicated by the acquired identifier, the check processing unit 3d performs the following process. In other words, the check processing unit 3d acquires the capacitance of the input pins of all the cells connected to the output pin of the driving cell indicated by the acquired identifier from the "input pin capacitance" item of the first analysis table 2d (S304). The check processing unit 3d calculates the sum total of the acquired capacitance of the input pins (S305).

The check processing unit 3d determines whether or not the acquired drivability of the output pin of the driving cell is equal to or more than the calculated sum total of the capacitance of the input pins (S306). If the acquired drivability of the output pin of the driving cell is not equal to or more than the calculated sum total of the capacitance of the input pins (S306; No), the check processing unit 3d performs the following process. In other words, the check processing unit 3d registers, in the determination flag 2g, "0" indicating to be against the design rules (S312), stores the process result in the internal memory, and returns.

If the acquired drivability of the output pin of the driving cell is equal to or more than the calculated sum total of the capacitance of the input pins (S306; Yes), the check processing unit 3d performs the following process. In other words, the check processing unit 3d acquires the maximum fan-out registered in the design rules 2c (S307). The check processing unit 3d acquires the fan-out of the driving cell indicated by the acquired identifier from the "output pin fanout" item of the second analysis table 2e (S308).

The check processing unit 3d determines whether or not the fan-out of the driving cell indicated by the acquired identifier is equal to or less than the number obtained by subtracting one from the acquired maximum fan-out (the maximum fan-out−1) (S309). If the fan-out of the driving cell indicated by the acquired identifier is not equal to or less than (the maximum fan-out−1) (S309; No), the check processing unit 3d proceeds to S312.

If the fan-out of the driving cell indicated by the acquired identifier is equal to or less than (the maximum fan-out−1) (S309; Yes), the check processing unit 3d performs the following process. In other words, the check processing unit 3d determines whether or not the skew of all the cells connected to the driving cell indicated by the acquired identifier meets the predetermined standard, assuming that the selected cell is connected to the driving cell indicated by the acquired identifier (S310). If the predetermined standard is not met (S310; No), the check processing unit 3d proceeds to S312.

If the predetermined standard is met (S310; Yes), the check processing unit 3d registers, in the determination flag 2g, "1" indicating to be not against the design rules (S311), stores the process result in the internal memory, and returns.

As described above, the design support apparatus 1 according to the embodiment performs the following processes on the plurality of cells 18_1 to 18_16 (hereinafter simply expressed as the cell 18), respectively. In other words, the design support apparatus 1 identifies the driving cell 16 connected to the cell 18 via a wire in the semiconductor integrated circuit based on the circuit information 2a. The design support apparatus 1 identifies another driving cell 16 whose input terminals are connected to cells that are the same as cells connected to the input terminals of the driving cell 16. The design support apparatus 1 identifies other cells 18 connected to the identified driving cell 16 and another driving cell 16 via the wires. The design support apparatus 1 identifies another cell 18 belonging to the same group based on the redistribution information 2b, for each of the plurality of cells 18. The design support apparatus 1 performs the following process if the other cells 18 connected to the driving cell 16 and the another driving cell 16 via the wires include the another cell 18 belonging to the same group. In other words, the design support apparatus 1 selects the driving cell 16 connected via the wire to the another cell 18 belonging to the same group, the another cell 18 being included in the other cells 18 connected via the wires to the driving cell 16 and the another driving cell 16. If the cell 18 and the selected driving cell 16 satisfy the predetermined design rules, the design support apparatus 1 registers information that the cell 18 and the selected driving cell 16 are connected via the wire, in the circuit information 2a for each of the plurality of cells 18. If the predetermined design rules are not satisfied, the design support apparatus 1 copies the selected driving cell 16, and registers, in the circuit information 2a, information that the copied driving cell 16 and the cell 18 are connected via a wire. Therefore, the design support apparatus 1 automatically performs difficult redistribution of the clock tree. Accordingly, the clock tree can easily be redistributed.

Moreover, the design support apparatus 1 automatically performs difficult redistribution of the clock tree. Accordingly, it is possible to suppress the occurrence of inconsistency of logic due to a human error, and the like.

Moreover, the design support apparatus 1 automatically takes into account the design rules such as over the fan-out and overcapacitance. Accordingly, it is possible to shorten the designer's checking time after the redistribution of the clock tree.

Moreover, the design support apparatus 1 can keep copies of driving cells to a minimum.

The embodiment of the apparatus of the disclosure has hitherto been described. However, the present invention can be carried out in various difference modes other than the above-mentioned embodiment.

Figure 27:
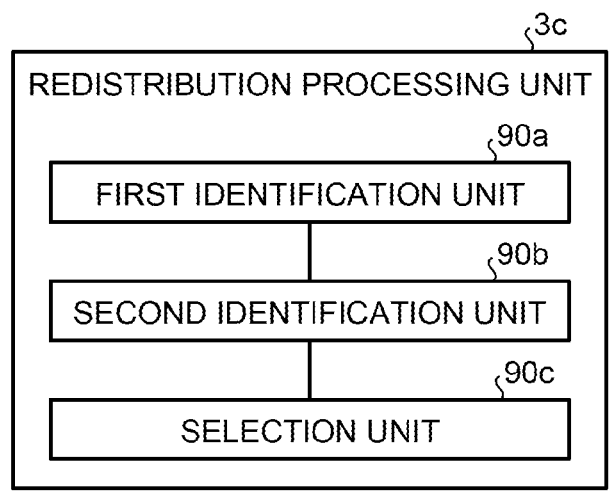
FIG. 27 is a diagram illustrating an example of a functional configuration of a redistribution processing unit according to the embodiment.

For example, the above-mentioned redistribution processing unit 3c can include a first identification unit, a second identification unit, and a selection unit. FIG. 27 is a diagram illustrating an example of a functional configuration of the redistribution processing unit according to the embodiment. As illustrated in FIG. 27, the redistribution processing unit 3c includes a first identification unit 90a, a second identification unit 90b, and a selection unit 90c. The first identification unit 90a executes, for example, the above-mentioned processing of Steps S205 to S213. The second identification unit 90b executes, for example, the above-mentioned processing of Steps S214 and S215. The selection unit 90c executes the processing of Steps S216 to S219 and S221 to S224.

Moreover, it is also possible to manually perform all or part of the processing described assuming that it is performed automatically, among the processing described in the embodiments. Moreover, it is also possible to automatically perform, in a known method, all or part of the processing described assuming that it is performed manually, among the processing described in the embodiments.

Moreover, it is possible to freely break down the processing in each step of each process described in the embodiments into smaller parts, or bring them together according to various loads, usage patterns, and the like. Moreover, it is also possible to omit the step.

Moreover, it is possible to change the order of the processing in each step of each process described in the embodiments according to various loads, usage patterns, and the like.

Moreover, the illustrated elements of the devices are functionally conceptual, and are not necessarily needed to be physically configured as illustrated. In other words, the specific state of the distribution/integration of the devices is not limited to the illustrations, and all or part thereof can be configured by functional or physical distribution/integration in any units according to various loads, usage patterns, and the like.

Design Support Program

Figure 28:
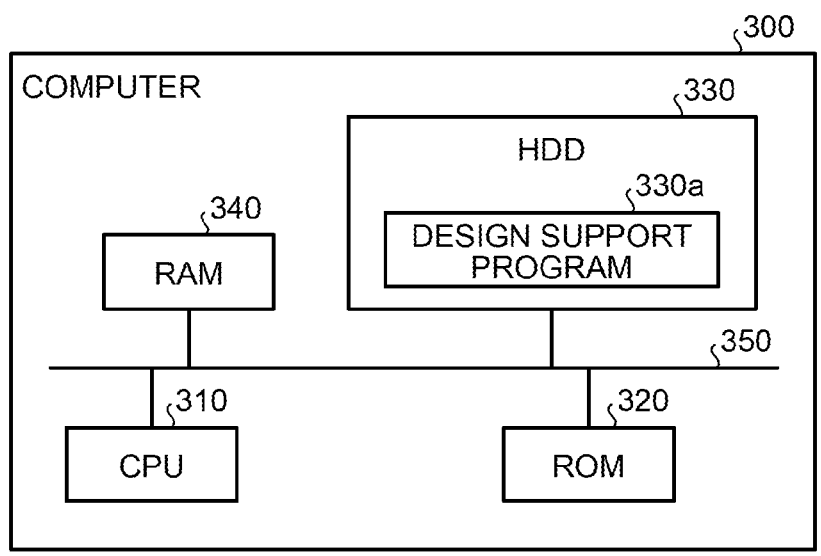
FIG. 28 is a diagram illustrating a computer that executes a design support program.

Moreover, the various processes of the design support apparatus 1 described in the above embodiments can also be achieved by executing a program prepared in advance by a computer system such as a personal computer or a workstation. Hence, a description is given below of an example of a computer that executes a design support program including similar functions to the design support apparatus 1 described in the above embodiments with reference to FIG. 28. FIG. 28 is a diagram illustrating the computer that executes the design support program.

As illustrated in FIG. 28, a computer 300 includes a CPU 310, ROM 320, an HDD (Hard Disk Drive) 330, and RAM 340. These devices 310 to 340 are connected via a bus 350.

A basic program such as an OS (Operating System) is stored in the ROM 320. Moreover, a design support program 330a exercising functions similar to the units 3a to 3f and 90a to 90c illustrated in the above embodiments is stored in advance in the HDD 330. Moreover, various pieces of data stored in the storage unit 2 are contained in the HDD 330.

The CPU 310 then reads the design support program 330a from the HDD 330 and executes the design support program 330a.

The CPU 310 then reads various pieces of data and stores the data in the RAM 340. Furthermore, the CPU 310 executes the design support program 330a using the various pieces of data stored in the RAM 340. With respect to the data stored in the RAM 340, not all the data may always be stored in the RAM 340. It is sufficient if the data to be used for the process is stored in the RAM 340.

The above design support program 330a is not necessarily stored in the HDD 330 from the beginning.

For example, the program is stored in a "portable physical medium" such as a flexible disk (FD), a CD-ROM, a DVD disk, a magneto-optical disk, or an IC card that is inserted into the computer 300. It may be configured such that the computer 300 reads the program from them and executes the program.

Furthermore, the program is stored in "another computer (or server)" to be connected to the computer 300 via a public network, the Internet, a LAN, a WAN, or the like. It may be configured such that the computer 300 reads the program from them and executes the program.

A clock tree can easily be redistributed.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A design support apparatus comprising:
   a memory; and
   a processor coupled to the memory, wherein the processor executes a process including:
   storing first information indicating a predetermined circuit including a plurality of first cells operating based on an input clock signal, a plurality of second cells that inputs the clock signal into any of the plurality of first cells via wires, and the wires that connect each of the plurality of first cells and each of the plurality of second cells, and second information indicating the content of a change in a placement of the first cell in the predetermined circuit, the second information being defined such that the first cells connected to the same second cell belong to the same logical group;
   for each of the plurality of first cells, first identifying the second cell connected to the first cell via the wire in the predetermined circuit based on the first information;
   second identifying another second cell whose input terminals are connected to cells being the same as cells connected to input terminals of the second cell;
   third identifying other first cells connected via the wires to the identified second cell and another second cell;
   fourth identifying another first cell belonging to the same logical group based on the second information for each of the plurality of first cells;
   for each of the plurality of first cells, selecting the second cell connected via the wire to the another first cell identified at the fourth identifying, the another first cell being included in the other first cells identified at the first to third identifying, when the another first cell identified at the fourth identifying is included in the other first cells identified at the first to third identifying;
   for each of the plurality of first cells, registering, in the first information, information that the first cell and the second cell selected at the selecting are connected via the wire when the first cell and the second cell selected at the selecting satisfy predetermined design rules; and
   copying the second cell selected at the selecting, and registering, in the first information, information that the copied second cell and the first cell are connected via the wire when the predetermined design rules are not satisfied.

2. The design support apparatus according to claim 1, wherein, for each of the plurality of first cells, the selecting includes selecting the second cell identified at the first to third identifying when another first cell is not connected via the wire to the second cell identified at the first to third identifying in the predetermined circuit indicated by the first information in a case where the another first cell identified at the fourth identifying is not included in the other first cells identified at the first to third identifying.

3. The design support apparatus according to claim 1, wherein, for each of the plurality of first cells, the selecting includes copying the second cell identified at the first to third identifying and selecting the copied second cell when another first cell is connected via the wire to the second cell identified at the first to third identifying in the predetermined circuit indicated by the first information in a case where the another first cell identified at the fourth identifying is not included in the other first cells identified at the first to third identifying.

4. A non-transitory computer-readable recording medium having stored therein a program that causes a computer to execute a design support process comprising:
   referring to a storage that stores first information indicating a predetermined circuit including a plurality of first cells operating based on an input clock signal, a plurality of second cells that inputs the clock signal into any of the plurality of first cells via wires, and the wires that connect each of the plurality of first cells and each of the plurality of second cells, and second information indicating the content of a change in a placement of the first cell in the predetermined circuit, the second information being defined such that the first cells connected to the same second cell belong to the same logical group;
   for each of the plurality of first cells, first identifying the second cell connected to the first cell via the wire in the predetermined circuit;
   second identifying another second cell whose input terminals are connected to cells being the same as cells connected to input terminals of the second cell;
   third identifying other first cells connected via the wires to the identified second cell and another second cell;
   fourth identifying another first cell belonging to the same logical group for each of the plurality of first cells;
   for each of the plurality of first cells, selecting the second cell connected via the wire to the another first cell belonging to the same group, the another first cell being included in the other first cells connected via the wires to the identified second cell and another second cell, when the another first cell belonging to the same group is included in the other first cells connected via the wires to the identified second cell and another second cell; and
   for each of the plurality of first cells, registering, in the first information, information that the first cell and the selected second cell are connected via the wire when the first cell and the selected second cell satisfy predetermined design rules, and copying the selected second cell and registering, in the first information, information that the copied second cell and the first cell are connected via the wire when the predetermined design rules are not satisfied.

5. A design support method comprising:
   referring to, using a processor, a storage that stores first information indicating a predetermined circuit including a plurality of first cells operating based on an input clock signal, a plurality of second cells that inputs the clock signal into any of the plurality of first cells via wires, and the wires that connect each of the plurality of first cells and each of the plurality of second cells, and second information indicating the content of a change in a placement of the first cell in the predetermined circuit, the second information being defined such that the first cells connected to the same second cell belong to the same logical group;

for each of the plurality of first cells, first identifying, using the processor, the second cell connected to the first cell via the wire in the predetermined circuit;

second identifying another second cell whose input terminals are connected to cells being the same as cells connected to input terminals of the second cell;

third identifying other first cells connected via the wires to the identified second cell and another second cell;

fourth identifying, using the processor, another first cell belonging to the same group for each of the plurality of first cells;

for each of the plurality of first cells, selecting, using the processor, the second cell connected via the wire to the another first cell belonging to the same logical group, the another first cell being included in the other first cells connected via the wires to the identified second cell and another second cell, when the another first cell belonging to the same group is included in the other first cells connected via the wires to the identified second cell and another second cell; and for each of the plurality of first cells, registering, using the processor, in the first information, information that the first cell and the selected second cell are connected via the wire when the first cell and the selected second cell satisfy predetermined design rules, and copying the selected second cell and registering, in the first information, information that the copied second cell and the first cell are connected via the wire when the predetermined design rules are not satisfied.

* * * * *

UNITED STATES PATENT AND TRADEMARK OFFICE
CERTIFICATE OF CORRECTION

| | | |
|---|---|---|
| PATENT NO. | : 8,887,108 B1 | Page 1 of 1 |
| APPLICATION NO. | : 14/277083 | |
| DATED | : November 11, 2014 | |
| INVENTOR(S) | : Rimi Mizuno | |

It is certified that error appears in the above-identified patent and that said Letters Patent is hereby corrected as shown below:

Title Page, item (54) and in the Specification, Column 1, lines 1-2, should read;

--DESIGN SUPPORT APPARATUS, DESIGN SUPPORT METHOD, AND RECORDING MEDIUM--.

Signed and Sealed this
Seventh Day of April, 2015

Michelle K. Lee
*Director of the United States Patent and Trademark Office*